US008848449B2

(12) United States Patent
Endo

(10) Patent No.: US 8,848,449 B2
(45) Date of Patent: Sep. 30, 2014

(54) MEMORY DEVICE AND METHOD FOR DRIVING MEMORY DEVICE

(75) Inventor: Masami Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 159 days.

(21) Appl. No.: 13/472,549

(22) Filed: May 16, 2012

(65) Prior Publication Data

US 2012/0294080 A1    Nov. 22, 2012

(30) Foreign Application Priority Data

May 20, 2011    (JP) ................................. 2011-113949

(51) Int. Cl.
| | | |
|---|---|---|
| G11C 16/04 | (2006.01) | |
| G11C 11/408 | (2006.01) | |
| G11C 8/12 | (2006.01) | |
| G11C 29/26 | (2006.01) | |
| G11C 29/12 | (2006.01) | |

(52) U.S. Cl.
CPC .... G11C 11/4085 (2013.01); *G11C 2029/1206* (2013.01); *G11C 29/12005* (2013.01); *G11C 8/12* (2013.01); *G11C 29/26* (2013.01)
USPC ................... 365/185.2; 365/182; 365/189.11; 365/191

(58) Field of Classification Search
CPC .... G11C 29/12005; G11C 29/26; G11C 8/12; G11C 2029/1206
USPC .......................... 365/185.2, 189.11, 182, 191
See application file for complete search history.

(56) References Cited

U.S. PATENT DOCUMENTS

| 4,466,081 A | | 8/1984 | Masuoka | |
|---|---|---|---|---|
| 4,751,679 A | * | 6/1988 | Dehganpour | ................. 365/201 |
| 4,769,792 A | * | 9/1988 | Nogami et al. | ............... 365/222 |
| 5,398,207 A | * | 3/1995 | Tsuchida et al. | .............. 365/226 |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Kinam Kim; "Technology for sub-50nm DRAM and NAND Flash Manufacturing"; IEDM 05: Technical Digest of International Electron Devices Meeting; Dec. 5, 2005; pp. 333-336.

(Continued)

*Primary Examiner* — Pho M Luu
(74) *Attorney, Agent, or Firm* — Fish & Richardson P.C.

(57) ABSTRACT

A memory device capable of being operated with a single potential uses capacitive coupling of a capacitor connected to a gate of a transistor for data writing. That is, the capacitive coupling is induced by inputting a signal, which is supplied by a delay circuit configured to delay a write signal having a potential equal to the power supply potential, to the capacitor. Increase in the potential of the gate by the capacitive coupling allows the transistor to be turned on in association with the power supply potential applied to the gate from a power supply. Data is written by inputting a signal having a potential equal to the power supply potential or a grounded potential to a node through the transistor.

31 Claims, 16 Drawing Sheets

(56) References Cited

U.S. PATENT DOCUMENTS

| | | | |
|---|---|---|---|
| 5,512,845 A * | 4/1996 | Yuh | 326/88 |
| 5,731,856 A | 3/1998 | Kim et al. | |
| 5,744,864 A | 4/1998 | Cillessen et al. | |
| 5,751,643 A * | 5/1998 | Lines | 365/189.11 |
| 5,986,935 A * | 11/1999 | Iyama et al. | 365/185.18 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,687,808 B2 | 3/2010 | Umezaki | |
| 7,732,819 B2 | 6/2010 | Akimoto et al. | |
| 7,964,876 B2 | 6/2011 | Umezaki | |
| 7,994,500 B2 | 8/2011 | Kim et al. | |
| 8,058,645 B2 | 11/2011 | Jeong et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0320458 A1 | 12/2010 | Umeda et al. | |
| 2010/0320459 A1 | 12/2010 | Umeda et al. | |
| 2011/0018915 A1 | 1/2011 | Umezaki et al. | |
| 2011/0064186 A1 | 3/2011 | Koyama | |
| 2011/0140108 A1 | 6/2011 | Kimura et al. | |
| 2011/0193083 A1 | 8/2011 | Kim et al. | |
| 2011/0199807 A1 | 8/2011 | Saito et al. | |
| 2011/0204928 A1 | 8/2011 | Umezaki et al. | |
| 2011/0215328 A1 | 9/2011 | Morosawa et al. | |
| 2011/0215787 A1 | 9/2011 | Shionoiri et al. | |
| 2011/0227066 A1 | 9/2011 | Umezaki | |
| 2012/0026774 A1 | 2/2012 | Shionoiri | |
| 2012/0119205 A1 | 5/2012 | Taniguchi et al. | |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-231613 A | 10/2009 |
| JP | 2010-016347 A | 1/2010 |
| JP | 4415062 A | 2/2010 |
| JP | 2010-067954 A | 3/2010 |
| JP | 2010-177431 A | 8/2010 |
| JP | 4571221 A | 10/2010 |
| JP | 2012-160679 A | 8/2012 |

(56) References Cited

FOREIGN PATENT DOCUMENTS

| | | |
|---|---|---|
| WO | 2004/114391 A1 | 12/2004 |
| WO | 2008/133345 A1 | 11/2008 |

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

(56) References Cited

OTHER PUBLICATIONS

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, p. 21-008 (with full English translation).

* cited by examiner

● In
○ Sn
○ Zn
● O

● In
● Ga
● Zn
● O

- In
- Ga or Zn
- O

- In
- Ga
- Zn
- O

MEMORY DEVICE AND METHOD FOR DRIVING MEMORY DEVICE

BACKGROUND OF THE INVENTION

1. Field of the Invention

The present invention relates to a memory device and a method for driving a memory device.

2. Description of the Related Art

There are many kinds of memory devices including semiconductors. For example, a dynamic random access memory (DRAM), a static random access memory (SRAM), an electrically erasable and programmable read only memory (EEPROM), a flash memory, and the like can be given.

A typical example of a volatile memory device is a DRAM. A memory cell of the DRAM includes a writing and reading transistor and a capacitor, and data is stored by holding charge in the capacitor provided in the memory cell (see Non-Patent Document 1). However, because leak current flows in a switching transistor even when the switching transistor is in an off state, rewriting (refresh) operation needs to be performed at intervals of several tens of milliseconds for data holding, which leads to an increase in power consumption.

The DRAM described in Non-Patent Document 1 employs a method for reducing the area occupied by one memory cell and also maintaining an effective channel length of a transistor so as not to cause a short-channel effect by forming a three-dimensional transistor in the memory cell. For example, a structure is disclosed in which a U-shaped vertically long groove is formed in a region where a channel portion of a transistor is formed, a gate insulating layer is formed along a wall surface in the groove, and a gate electrode is formed so as to fill the groove.

However, a conventional DRAM still needs to be refreshed at intervals of several tens of milliseconds to hold data, which leads to an increase in power consumption. In addition, a transistor therein is frequently turned on and off; thus, deterioration of the transistor is also a problem.

A typical example of a nonvolatile memory device is a flash memory. A flash memory includes a floating gate between a gate electrode and a channel formation region in a transistor and stores data by holding charge in the floating gate. Therefore, a flash memory is advantageous in that a data holding period is long and refresh operation needed in a volatile memory device is unnecessary (see Patent Document 1).

However, a gate insulating layer included in the memory device deteriorates by tunneling current in writing, so that the memory device does not function after a number of writing operations. Further, a relatively high voltage and a relatively long time are needed for injecting charge to the floating gate and removing the charge therefrom; therefore, it is not easy to increase the speed of write and erase operations.

REFERENCE

Patent Document

[Patent Document 1] Japanese Published Patent Application No. S57-105889

NON-PATENT DOCUMENT

[Non-Patent Document 1] Kinam Kim, "Technology for sub-50 nm DRAM and NAND Flash Manufacturing", International Electron Devices Meeting, 2005. IEDM Technical Digest, December 2005, pp. 333-336

SUMMARY OF THE INVENTION

Many of memory devices that use semiconductors increase their data writing speed by employing a configuration in which plural power supply potentials are used for driving.

For example in a memory device where charge is stored in a capacitor through a transistor functioning as a switch to write data, the difference between the potential of a source and that of a gate in the transistor needs to be large enough in order to write data to the memory device at high speed. Accordingly, a power supply potential for driving the gate of the transistor and a power supply potential of a signal to write data to the capacitor are necessary, and in addition, the power supply potential for driving the gate needs to be higher than the power supply potential of a signal to write date to the capacitor.

The plurality of power supply potentials is generated with the use of a voltage converter (also referred to as converter). The conversion efficiency of the voltage converter is lower than 1; accordingly, as the number of converters used in the memory device increases, the use efficiency of electric power in the memory device decreases.

The present invention is made in view of the foregoing technical background. An object of an embodiment of the present invention is to provide a memory device in which power consumption is reduced without sacrificing writing speed. Another object of an embodiment of the present invention is to provide a method for driving the memory device.

In order to achieve an object, a bootstrap circuit is used without using the voltage converter, whereby a memory device which can be operated by only a single potential equal to a potential of a signal for data writing can be formed. Specifically, a power supply potential is input from a power supply to a first node to which a gate of a transistor and one electrode of a first capacitor are connected so that charge is accumulated in the first node. Then, a potential which is equal to the power supply potential is applied to the other electrode of the first capacitor, so that the potential of the gate of the transistor becomes higher than the power supply potential due to the capacitive coupling. The increase in potential of the gate of the transistor allows the transistor to be turned on, and an input data signal having the potential equal to the power supply potential or a grounded potential is input to a node through the transistor, by which data writing is completed. This data writing mechanism is able to operate the memory device using a single potential, and the higher potential of the gate of the transistor than the power supply potential allows the reduction of the number of voltage converters and the improvement of the writing speed, which contributes to the reduction of the power consumption of the memory device.

An embodiment of the present invention is a memory device which includes a controller configured to select an operation, according to a write signal, from among an input operation of a power supply potential to a first node, a holding operation of a potential at the first node, and a grounding operation of the potential at the first node according to a write signal; a first capacitor including one electrode connected to the first node; a delay circuit configured to delay the write signal and output a delayed write signal to the other electrode of the first capacitor; a first transistor (n-channel normally-off transistor) including a gate electrode connected to the first node, a first electrode to which an input data signal is input, and a second electrode connected to a second node in which the input data signal is stored; and a reading circuit connected to the second node. In the memory device, the second node is connected to one of electrodes of a second capacitor and a gate electrode of a second transistor included in the reading circuit. The other electrode of the second capacitor is grounded. The reading circuit outputs a signal corresponding to a potential held at the second node according to a read signal.

The memory device of an embodiment of the present invention uses potentials equal to potentials of signals written as data, thereby achieving high-speed writing operation. Accordingly, the number of voltage converters can be reduced, and power consumption of the memory device can be reduced.

The controller used in the memory device according to the present invention preferably includes a switch that inputs a power supply potential or a ground potential to the first node according to the write signal, between the power supply and the first node; and a diode connected between the power supply and the switch so that a direction from the power supply to the first node is a forward direction for the diode.

In the case of employing the above-described circuit configuration of the controller, a controller having a relatively simple circuit can be formed. Thus, a memory device with reduced power consumption, which does not use a complicated circuit, can be provided.

One of a source electrode and a drain electrode of the first transistor used in the memory device is electrically connected to the second node where data is held. Therefore, the first transistor is preferably a transistor with small off-state current. For example, the off-state current of the first transistor per micrometer of a channel width is preferably equal to or lower than $1 \times 10^{-17}$ A/μm.

It is preferable that a transistor including an oxide semiconductor in a semiconductor layer be used as the first transistor. A transistor including an oxide semiconductor layer in which a channel is formed has a small number of carriers and thereby can have an extremely small off-state current.

Another embodiment of the present invention is a method for driving a memory device including the following first to fifth steps. The first step is a step of inputting a first write signal having a potential equal to a power supply potential to a controller and a delay circuit, whereby the controller inputs the power supply potential to the first node in response to the first write signal, whereby charge corresponding to the power supply potential is held at a first node to which one electrode of a first capacitor is connected. The second step is a step of inputting the first write signal, which is delayed by the delay circuit, to the other electrode of the first capacitor, whereby a potential at the first node connected to a gate electrode of a first transistor is made to be higher than the power supply potential. The third step is a step of inputting an input data signal to a first electrode of the first transistor, whereby charge corresponding to the potential of the input data signal is written to a second node to which a second electrode of the first transistor and one of electrodes of a second capacitor are connected where the other electrode of the second capacitor is grounded. The fourth step is a step of inputting a second write signal having a ground potential to the controller and the delay circuit, whereby the gate electrode is grounded and the input data signal is held at the second node with the use of the first transistor having the grounded gate electrode. The fifth step is a step of inputting a read signal to a reading circuit including a second transistor having a gate electrode connected to the second node, whereby on- and off-states of the second transistor is determined and thereby a potential at the second node is read.

With the present invention, a memory device in which power consumption is reduced without sacrificing writing speed can be provided. Further, a method for driving the memory device can be provided.

DETAILED DESCRIPTION OF THE INVENTION

Figure 1:
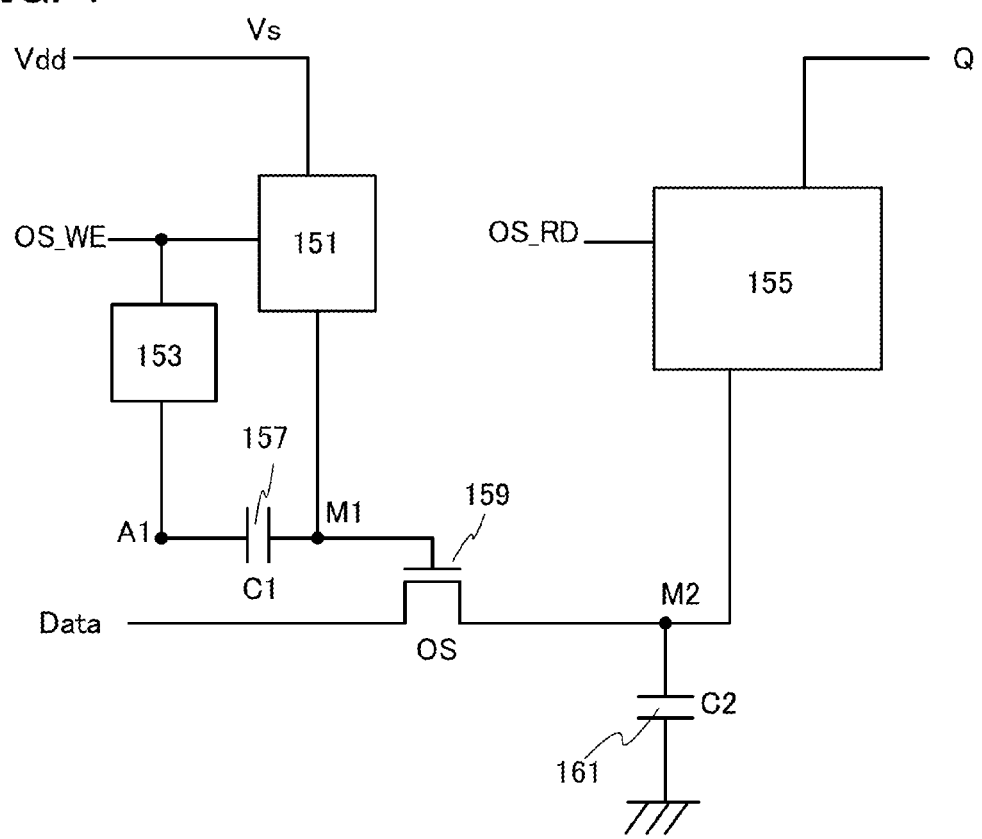
FIG. 1 illustrates a memory device according to an embodiment of the present invention.

Hereinafter, embodiments of the present invention will be described in detail with reference to the accompanying drawings. Note that the present invention is not limited to the following description, and it is easily understood by those skilled in the art that modes and details thereof can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Functions of a "source" and a "drain" might interchange when a transistor of opposite polarity is used or the direction of current flow is changed in circuit operation, for example. Therefore, the terms "source" and "drain" can be used to denote the drain and the source, respectively, in this specification. Further in this specification, one of a source and a drain of a transistor is called a "first electrode", and the other of the source and the drain is called a "second electrode" in some cases.

Note that in this specification and the like, the term "electrically connected" includes the case where components are connected through an "object having any electric function." There is no particular limitation on the "object having any electric function" as long as electric signals can be transmitted and received between components that are connected through the object. Examples of the "object having any electric function" include a switching element such as a transistor, a resistor, a coil, a capacitor, and an element with a variety of functions in addition to an electrode and a wiring.

Note that a node in this specification and the like means an element (e.g., a wiring) which enables electric connection between elements included in a circuit. Thus, a "node to which A is connected" refers to a wiring which is electrically connected to A and can be regarded as having the same potential as A. Note that even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

Note that the term "voltage" generally means a difference between potentials at two points (also referred to as a potential difference). However, in some cases, values of both a voltage and a potential are represented using volt (V) in a circuit diagram or the like, so that it is difficult to discriminate between them. Thus, in this specification, a potential difference between a potential at one point and a reference potential is sometimes referred to as a voltage at the point unless otherwise specified.

(Embodiment 1)

In this embodiment, a memory device of an embodiment of the present invention will be described. The memory device of this embodiment is illustrated in FIG. 1.

The memory device in FIG. 1 includes a controller 151, a delay circuit 153, a reading circuit 155, a first capacitor 157, a first transistor 159, and a second capacitor 161.

An output terminal of the controller 151, one electrode of the first capacitor 157, and a gate electrode of the first transistor 159 are electrically connected to each other to form a first node (M1) where charge is held. In addition, a second electrode of the first transistor 159, one of electrodes of the second capacitor 161, and an input terminal of the reading circuit 155 are electrically connected to each other to form a second node (M2) where charge is held. The other electrode of the second capacitor 161 is grounded.

A write signal (OS_WE) is input to the controller 151, and in accordance with the potential of the write signal, a power supply potential (Vdd) or a ground potential is input to the first node. When the power supply potential is input to the first node, charge corresponding to the power supply potential is accumulated in the first capacitor that is connected to the first node. Note that in this specification, a period from input of power supply potential to the first node by the controller 151 to accumulation of the charge corresponding to the power supply potential in the first node and the first capacitor is referred to as "precharge period".

In this embodiment, when an H-level signal is input as the write signal (OS_WE) to the controller 151, the first node is connected to a power supply. When an L-level signal is input as the write signal (OS_WE) to the controller 151, the first node is grounded. The controller 151 also has a function of holding charge accumulated in the first capacitor that is electrically connected to the first node. The controller that can be used in the memory device in the present invention is not limited to the controller having the above-described structure, and may have a structure in which when an H-level signal is input as the write signal, the first node is grounded and when an L-level signal is input, the first node is connected to the power supply.

Note that an H-level and an L-level signal here are a signal having a potential equal to the power supply potential and a signal having a potential equal to the ground potential, respectively. By inputting a signal having a potential equal to the power supply potential as the H-level signal and inputting a signal having a potential equal to the ground potential as the L-level signal, the number of voltage converters in the memory device can be reduced, whereby power consumption can be reduced. Here, the expression "potential equal to the power supply potential or the ground potential" is used to express that the potential is not a potential obtained by changing the potential of the power supply potential or the ground potential with the use of a circuit for changing the voltage such as a voltage converter. Accordingly, even if the potential input as the power supply potential is lowered by a wiring or the like to become a potential that is not exactly equal to the power supply potential, the potential is treated as the potential having a potential equal to the power supply potential. The same applies to other signals described in this embodiment.

When an H-level signal is input as an input data signal to the memory device, the memory device holds charge corresponding to the power supply potential to store data.

The write signal (OS_WE) is input to the delay circuit 153. The delay circuit 153 delays the input write signal and outputs the delayed write signal to the other electrode of the first capacitor 157. The time for which the delay circuit 153 delays the write signal is at least equal to or longer than the time needed to input the power supply potential to the first node according to the write signal input to the controller 151 and accumulate charge corresponding to the power supply potential in the first node.

Figure 2:
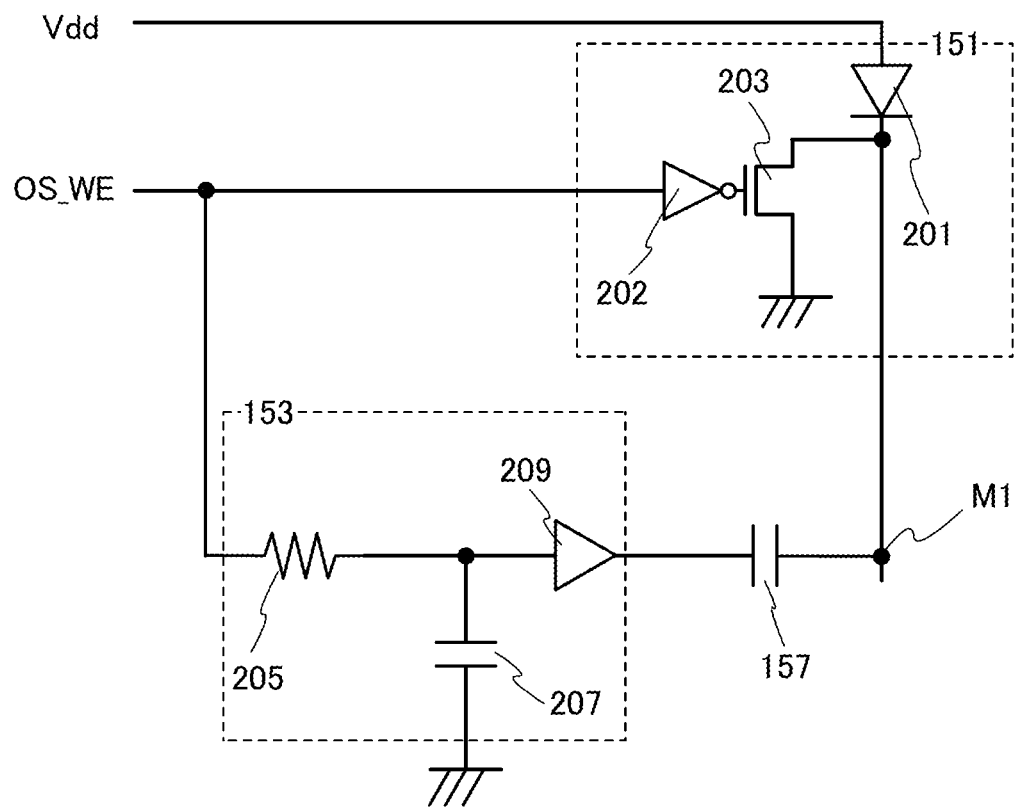
FIG. 2 illustrates part of a memory device according to an embodiment of the present invention.

FIG. 2 illustrates an example of a specific circuit configuration of the controller 151 and the delay circuit 153.

The controller 151 illustrated in FIG. 2 includes a diode 201, an inverter 202, and a first switching transistor 203. The diode 201 is positioned between the power supply and the first node and connected so that the direction from the power supply to the first node is the forward direction for the diode 201. The diode 201 has a function of holding charge that is accumulated in the first capacitor electrically connected to the first node. The write signal (OS_WE) is input to the inverter 202, and the inverted value of the write signal is output to a gate electrode of the first switching transistor 203. A first electrode of the first switching transistor 203 is grounded, and a second electrode thereof is electrically connected to a cathode of the diode 201.

When an H-level signal is input as the write signal (OS_WE), an L-level signal produced by the inverter 202 is input to the gate electrode of the first switching transistor 203, whereby the first switching transistor is turned off. As a result, the power supply potential is input to the first node (M1) to make the potential at the first node equal to the power supply potential. When an L-level signal is input as the write signal, an H-level signal produced by the inverter is input to the first switching transistor 203, whereby the first switching transistor is turned on. As a result, the ground potential is input to the first node and the accumulated charge is released.

The delay circuit 153 illustrated in FIG. 2 includes a resistor 205, a capacitor 207, and a buffer circuit 209. The write signal (OS_WE) is input to the resistor 205. The resistor 205 is electrically connected to the capacitor 207 having one grounded electrode and an input terminal of the buffer circuit 209. An output terminal of the buffer circuit 209 is electrically connected to the first capacitor 157.

As illustrated in FIG. 1, the one electrode of the first capacitor 157 is electrically connected to the output terminal of the controller 151 and the gate electrode of the first transistor 159. Through the controller 151, the power supply potential is input to the one electrode of the first capacitor 157. The other electrode of the first capacitor 157 is electrically connected to the output terminal of the delay circuit 153 and the delayed write signal is input to the other electrode of the first capacitor 157 from the delay circuit 153.

An input data signal (Data) is input to a first electrode of the first transistor 159.

The second electrode of the first transistor 159 forms the second node (M2) where the input data signal is held. Therefore, it is preferable that the off-state current between the first electrode and the second electrode in the first transistor 159 be small. The leak current of the off-state transistor per micrometer of a channel width is preferably equal to or lower than 10 aA ($1\times10^{-17}$ A), further preferably equal to or lower than 1 aA ($1\times10^{-18}$ A), still further preferably equal to or lower than 1 zA ($1\times10^{-21}$ A), and further preferably equal to or lower than 100 yA ($1\times10^{-22}$ A).

Here, for example, a transistor that uses an oxide semiconductor is applied to the first transistor 159. A transistor that uses an oxide semiconductor has a characteristic of a significantly small off-state current. For that reason, a potential at the second node can be held for an extremely long period when the first transistor 159 is off. When the memory device includes the second capacitor 161, charge supplied to the second node can be held more easily. In the drawing, the letter symbol "OS" is put under the circuit symbol of the first transistor 159 in order to indicate that the first transistor 159 is a transistor that uses an oxide semiconductor.

Through the first transistor 159, the input data signal (Data) is input to the second node, and charge corresponding to the input data signal is accumulated in the second capacitor 161.

The reading circuit 155 is a circuit which is electrically connected to the second node, reads a signal corresponding to the charge held at the second node according to a read signal (OS_RD), and outputs the read signal as an output signal Q. The reading circuit 155 is connected to a power supply not shown and driven by the power supply potential. Therefore, the memory device of this embodiment does not need to be provided with a voltage converter or the like for generating a potential, which leads to a reduction in power consumption.

The reading circuit 155 in this embodiment includes a transistor, a gate of which is electrically connected to the second electrode of the first transistor 159 and the electrode of the second capacitor 161. With this structure, the gate electrode of the transistor in the reading circuit is connected to the second node, which makes the off-state current flowing from the second node to the reading circuit extremely small. Accordingly, the second node can hold charge for a long time.

Figure 3:
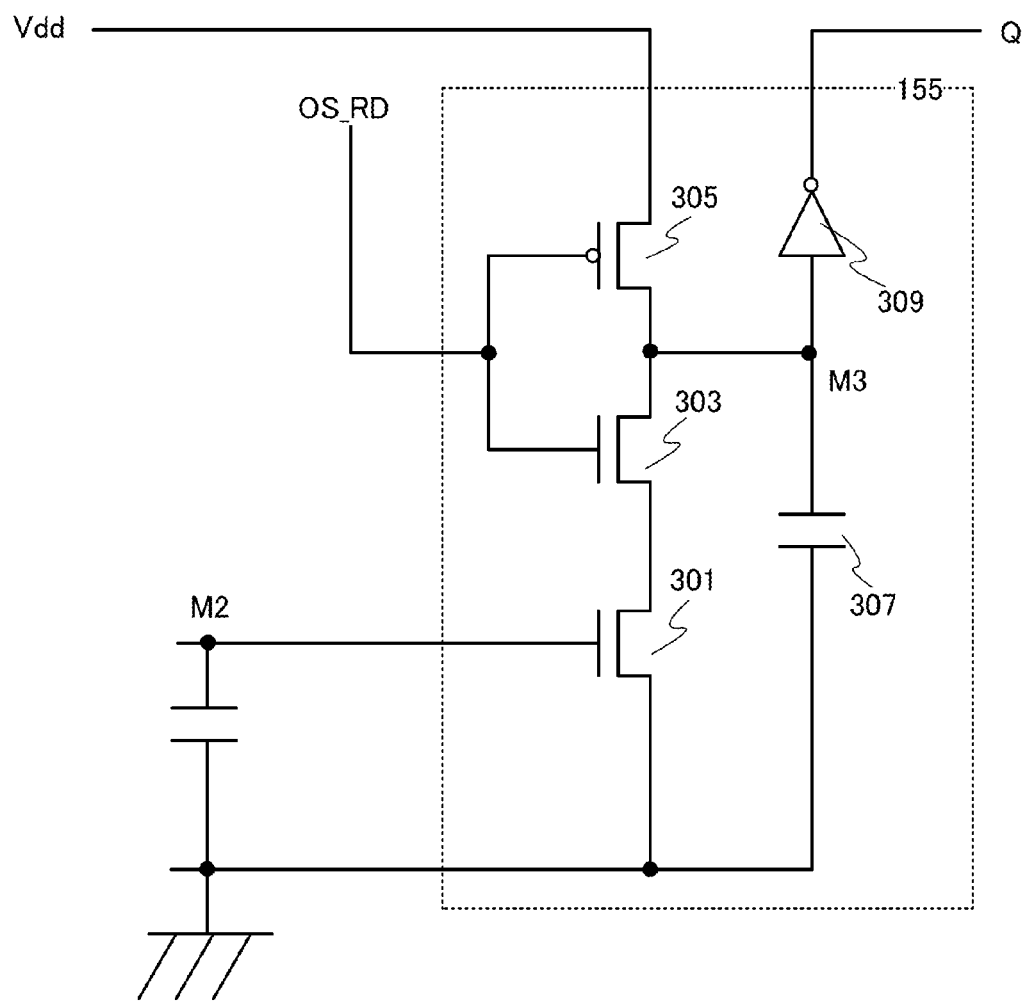
FIG. 3 illustrates part of a memory device according to an embodiment of the present invention.

For example, the reading circuit 155 can have a circuit configuration as illustrated in FIG. 3.

The reading circuit 155 in FIG. 3 includes a second transistor 301 having a gate electrode electrically connected to the second node (M2), a third transistor 303 having the same conductivity type as the second transistor 301, and a fourth transistor 305 having a different conductivity type from the second transistor 301 and the third transistor 303. In this embodiment, the second transistor 301 and the third transistor 303 are n-channel transistors, and the fourth transistor 305 is a p-channel transistor.

The gate electrode of the second transistor 301 is electrically connected to the second electrode of the first transistor 159 and the electrode of the second capacitor 161, and forms the second node (M2) where charge is held. A first electrode of the second transistor 301 is grounded, and a second electrode thereof is electrically connected to a first electrode of the third transistor 303.

A second electrode of the third transistor 303 is electrically connected to a first electrode of the fourth transistor 305, and a second electrode of the fourth transistor 305 is electrically connected to the power supply.

The read signal (OS_RD) is input to a gate electrode of the third transistor 303 and a gate electrode of the fourth transistor 305. Since the third transistor 303 and the fourth transistor 305 have different conductivity types, when one of the third transistor 303 and the fourth transistor 305 is on, the other thereof is off.

One electrode of a third capacitor 307 is grounded. The other electrode of the third capacitor 307 is electrically connected to the second electrode of the third transistor 303, the first electrode of the fourth transistor 305, and an inverter 309 to form a third node (M3).

An input terminal of the inverter 309 is electrically connected to the third node (M3). Therefore, a potential at the third node is input to the inverter 309. An output terminal of the inverter 309 serves as the output terminal of the reading circuit 155. Therefore, the value output from the inverter 309 is read out as a value held in the memory device.

The configuration of the reading circuit 155 is not limited to that described above and the reading circuit 155 may be a circuit that uses a comparator or the like, as long as it is a circuit that can determine the amount of charge held at the second node (M2).

Figure 4A:
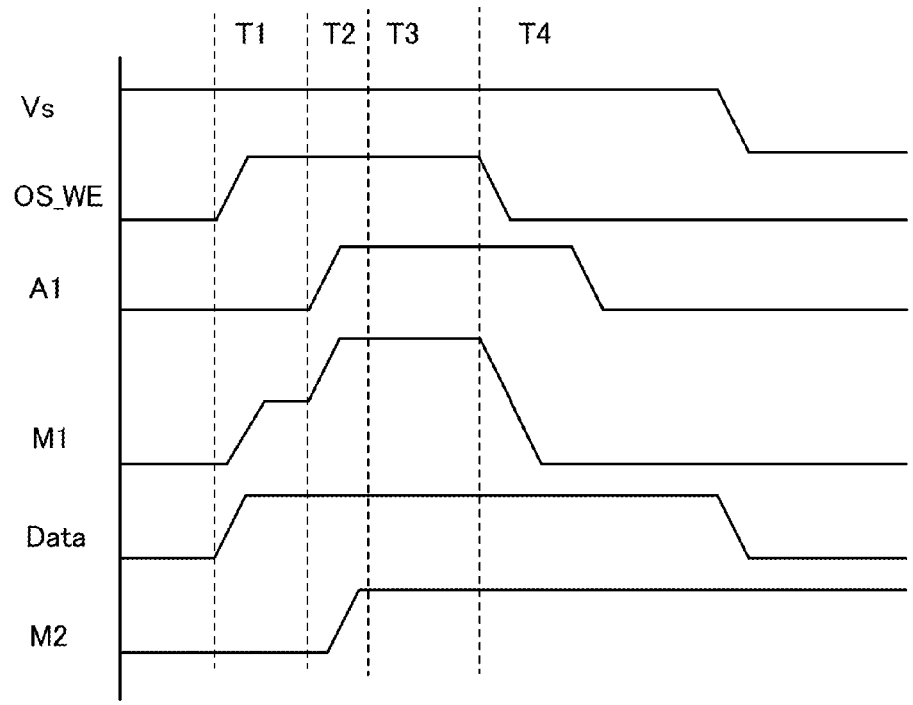
FIGS. 4A and 4B are timing charts of a memory device according to the present invention.
Figure 4B:
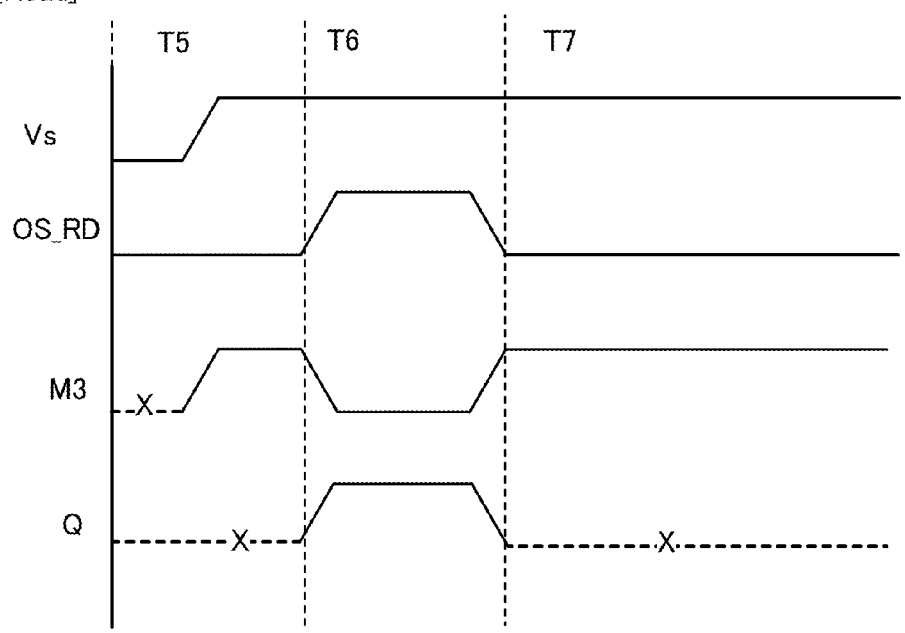

Next, a method for driving the memory device of this embodiment will be described. FIGS. 4A and 4B are timing charts in driving the memory device according to the present invention.

FIG. 4A is a timing chart of writing operation of the memory device of this embodiment. In the timing chart, Vs denotes the potential input to the controller from the power supply, and OS_WE denotes the potential of the write signal. Further, A1 denotes the potential of the other electrode of the first capacitor 157, Data denotes the potential of the input data signal, M1 denotes the potential of the first node, and M2 denotes the potential of the second node.

In the initial state, the first node is grounded, so that charge is not accumulated in the first capacitor 157 that is connected to the first node. Consequently, the potential at the first node is a ground potential. Similarly, the potential at the second node (M2) is set to a ground potential. The power supply is on (H-level potential) in the initial state. Note that the potential of the H-level signal is a power supply potential Vdd.

A method for writing data to the memory device will be described.

In the first step in writing to the memory device, an H-level signal as the write signal (OS_WE) is input to the controller 151 and the delay circuit 153. Upon input of the H-level signal to the controller, the power supply potential is input to the first node, and the potential (M1) at the first node increases to the power supply potential Vdd (see Period T1 in FIG. 4A).

Upon input of the power supply potential Vdd to the first node, charge corresponding to the power supply potential Vdd is accumulated in the first capacitor 157 that is connected to the first node, and the precharge period (Period T1 in FIG. 4A) ends.

In the following second step, the write signal (H-level signal) input to the delay circuit 153 is delayed by the delay circuit and input to the other electrode (A1) of the first capacitor 157 (see Period T2 in FIG. 4A).

In response to the input of the H-level signal to the other electrode of the first capacitor 157, the potential of the other electrode of the first capacitor 157 increases by the potential of the input signal, that is, by the potential equal to the potential of the H-level signal (=the power supply potential Vdd). Responding to this, the one electrode of the first capacitor 157 also increases by the power supply potential Vdd due to the capacitive coupling with the other electrode of the first capacitor 157.

At this time, charge corresponding to the power supply potential accumulated for the precharge period is accumulated in the first capacitor 157. The charge accumulated in the first node is held by the diode included in the controller 151. Therefore, when the delayed signal from the delay circuit 153 is input, the potential of the one electrode of the first capacitor 157 reaches a potential obtained by adding the charge caused by the delayed input signal to the charge accumulated in the precharge period which corresponds to the power supply potential Vdd, which is ideally 2Vdd. In other words, bootstrap operation by which the potential at the first node is increased with the use of capacitive coupling is performed in the second step.

In the following third step, the first transistor 159 is turned on in response to the increase in the potential of the first node, and an input data signal is input to the second node (M2) through the first transistor 159 (see Period T2 and Period T3 in FIG. 4A).

A power supply potential or a ground potential is input as the input data signal to the first electrode (source electrode) of the first transistor 159. In order to turn on the first transistor 159, a potential higher than the power supply potential is needed to the gate electrode of the first transistor.

However, if a voltage converter is used for enabling input of a high potential, power consumption is increased. Further, because the conversion efficiency of the voltage converter is not 100%, the use of the voltage converter causes electric power loss.

However, the memory device of this embodiment can input a high potential to the gate electrode of the first transistor 159 by utilizing the above-described bootstrap operation in the absence of the voltage converter, thereby achieving high-speed operation. Since the number of voltage converters can be reduced, a circuit with reduced power consumption can be formed.

When the first transistor 159 is turned on, the input data signal is input to the second node through the first transistor 159 and charge corresponding to the input data signal is accumulated in the second capacitor.

As the input data signal, the power supply potential or the ground potential is input. Here, inputting the power supply potential (H-level signal) is regarded as writing data "1", and inputting the ground potential (L-level signal) is regarded as writing data "0". By selectively inputting either of the data, 1-bit data can be written to the memory device.

At this time, since the potential of the gate electrode of the first transistor 159 is 2Vdd due to the bootstrap operation, regardless of the potential (the power supply potential or the ground potential) of the input data signal, the difference between the potential of the first electrode (source electrode) and that of the gate electrode in the first transistor 159 is enough to turn on the first transistor 159 at high speed. Thus, writing operation to the memory device can be performed at high speed.

The time at which the input data signal is input to the first electrode of the first transistor 159 may be anytime before the increase of the potential at the first node by the bootstrap operation. In this embodiment, the input data signal is input at the same time at which the potential of the write signal (OS_WE) is set to H level in the first step.

Here, writing of data to the memory device is completed. In the next step, the data is held in the memory device and the power supply is turned off, which will be described below.

In the fourth step, an L-level signal is input as the write signal to the controller 151 and the delay circuit 153. In response to the input of the L-level signal as the write signal to the controller, the controller 151 inputs the ground potential to the first node. As a result, charge accumulated in the first node is released to make the potential at the first node become a ground potential (see Period T4 in FIG. 4A).

Responding to this, the potential of the gate electrode of the first transistor 159 that is electrically connected to the first node also becomes the ground potential and the first transistor 159 is turned off, which stops the input of the input data signal to the second node.

The first transistor 159 is a transistor in which a channel is formed in an oxide semiconductor. Accordingly, the transistor has an extremely small off-state current. Even when the first transistor 159 is turned off and input of the input data signal to the second node stops, charge accumulated in the second node can be held for a long time.

Therefore, even when the power supply is turned off and the input of electric power to the memory device stops, data written to the second node can be held for a long time. Supply of electric power is not necessary for data holding; accordingly, power consumption can be reduced.

Through the above-described operation, data can be held in the memory device.

Next, operation for reading data held in the memory device will be described. FIG. 4B is a timing chart in reading data held in the memory device. In this embodiment, the description of the reading operation will be given using the circuit illustrated in FIG. 3 as the reading circuit 155.

In the timing chart of FIG. 4B, Vs denotes the potential of the power supply, OS_RD denotes the potential of the read signal, M3 denotes the potential of the other electrode of the third capacitor 307, and Q denotes the potential of the output of the memory device. The memory device outputs a signal corresponding to the charge held at the second node. Note that the timing chart of FIG. 4B shows the operation in the case where an H-level signal is stored in the memory device.

Before the reading operation, an L-level signal is input as the read signal (OS_RD). Accordingly, the third transistor 303 that is an n-channel transistor is in an off state. On the other hand, the fourth transistor 305 that is a p-channel transistor is in an on state. When the fourth transistor 305 is on, the power supply is electrically connected to the third capacitor 307, so that charge corresponding to the power supply potential is accumulated in the third capacitor 307 (see Period T5 in FIG. 4B).

Note that since the amount of the charge accumulated in the third capacitor 307 is indefinite until the power supply is turned on, such a state is represented by dotted lines as an indefinite state (X) in the timing chart.

In reading data stored in the memory device, the read signal (OS_RD) is set to an H-level signal first (Period T6). In response to the input of the H-level signal, the fourth transistor 305 that is a p-channel transistor is turned off and the third transistor 303 that is an n-channel transistor is turned on. As a result, the third capacitor 307 is electrically disconnected from the power supply and thereby the charge accumulated in the third capacitor flows into the third transistor 303.

At this time, since the third transistor 303 is on, the charge accumulated in the third capacitor 307 flows into the second transistor 301 through the third transistor 303. At this time, if an H-level signal is held at the second node M2 and an H-level signal is input to the gate electrode of the second transistor 301, the second transistor 301 is on and the charge accumulated in the third capacitor 307 flows and is released into the ground potential through the second transistor 301. As a result, the potential of the other electrode of the third capacitor 307 becomes L level (see Period T6 in FIG. 4B).

Then, the L-level signal is input to the inverter 309, and an H-level signal is output from the inverter 309. Since the output of the inverter 309 is extracted as the output of the memory device, the H-level signal is output from the memory device.

Here, a case in which the L-level signal, on the other hand, is held at the second node will be described.

In the case where the L-level signal is held at the second node, the second transistor 301 is off. Even when an H-level signal is input as the read signal to turn on the third transistor 303, the third capacitor 307 is not connected to the ground potential and the accumulated charge is held.

As a result, the charge accumulated in the third capacitor (the power supply potential=H-level signal) is input to the inverter 309, and the output from the inverter 309 becomes L level. Accordingly, the memory device outputs an L-level signal.

Through the above-described operation, the reading circuit 155 reads the charge held in the gate electrode of the second transistor 301 from the on/off state of the second transistor 301 and reads a signal corresponding to the data held at the second node.

Through the above-described operation, the memory device reads data.

After the reading operation finishes, the read signal is returned to the L level (see Period T7 in FIG. 4B). In the case of inputting an L-level signal as the read signal, the fourth transistor 305 that is a p-channel transistor is on and charge corresponding to the power supply potential is accumulated in the third capacitor 307.

During the input of the L-level signal as the read signal, the output from the memory device is the L level regardless of the potential held at the second node. Therefore, reading of data from the memory device is carried out only in the period in which the read signal is the H level. For this reason, the output from the memory device during the period in which the H-level signal is not input as the read signal is represented as being indefinite (x) in the timing chart.

For a further reduction of power consumption, the reading circuit 155 may have a structure in which a switch is provided between the power supply and the fourth transistor 305 to cut the connections between the power supply and other elements when the read signal is at the L level, that is, when the reading operation is not carried out.

The memory device of this embodiment is a memory device which utilizes the bootstrap circuit and thereby uses only potentials equal to potentials of signals written as data in the operation. Specifically, a power supply potential is input from a power supply to a first node to which a gate of a transistor and one electrode of a first capacitor are connected so that charge is accumulated in the first node. Then, a potential equal to the power supply potential is applied to the other electrode of the first capacitor, so that the potential of the gate of the transistor becomes higher than the power supply potential. The higher potential of the gate of the transistor than the power supply potential enables high-speed data writing, and the number of voltage converters can be reduced, thereby reducing power consumption of the memory device.

The memory device of this embodiment uses a transistor in which a channel layer is formed in an oxide semiconductor layer as the transistor which forms a node where data is held. Thus, off-state current is reduced, whereby the memory device can hold stored data for a long time.

The memory device of this embodiment uses a delay circuit for controlling the bootstrap circuit and the data input circuit with one signal, whereby a circuit with reduced power consumption can be formed with a relatively simple circuit configuration.

The memory device of this embodiment can be combined with any of the other embodiments as appropriate.

(Embodiment 2)

In this embodiment, structures of the controller included in the memory device in Embodiment 1, which are different from the structure in Embodiment 1, will be described.

Figure 5:
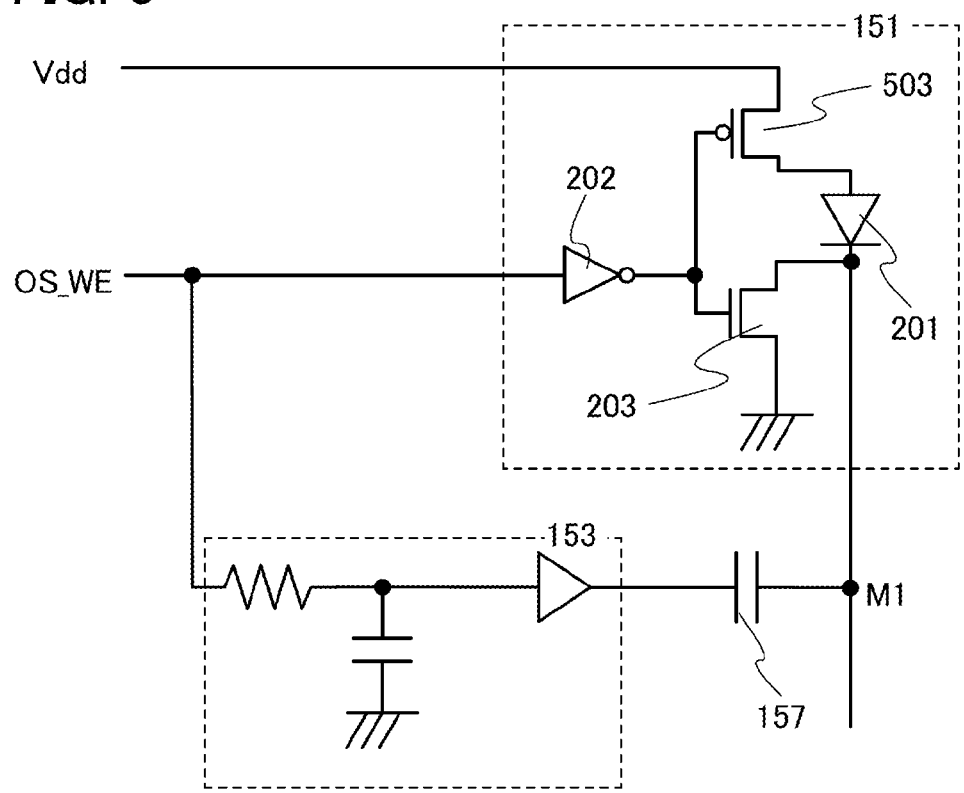
FIG. 5 illustrates part of a memory device according to an embodiment of the present invention.

FIG. 5 is a circuit diagram of the controller included in the memory device of this embodiment. In this embodiment, the points described in Embodiment 1 are not repeated and points different from those in Embodiment 1 will be mainly described.

The controller 151 in FIG. 5 has a second switching transistor 503 having a different conductivity type from the first switching transistor 203 between the diode 201 and the power supply, in addition to the elements illustrated in FIG. 2.

A write signal (OS_WE) is input to the gate electrode of the second switching transistor 503 through the inverter 202. A first electrode of the second switching transistor 503 is electrically connected to the power supply, and a second electrode of the second switching transistor 503 is electrically connected to the first node M1 through the diode 201.

The first switching transistor 203 is a switch that determines whether the first node is grounded. The second switching transistor 503 is a switch that determines the connection state between the first node and the power supply.

A write signal is also input to the gate electrode of the first switching transistor 203 through the inverter 202. Since the first switching transistor 203 and the second switching transistor 503 are transistors having different conductivity types, when one of the first switching transistor 203 and the second switching transistor 503 is on, the other is off.

Therefore, when the first node is grounded and charge is released, electrical connection between the first node and the power supply is cut. When the first node is connected to the power supply, the ground potential is not input.

With this structure, input of charge to the first node from the power supply during the time when the first node is grounded can be prevented, which enables a reduction in power consumption.

Figure 6:
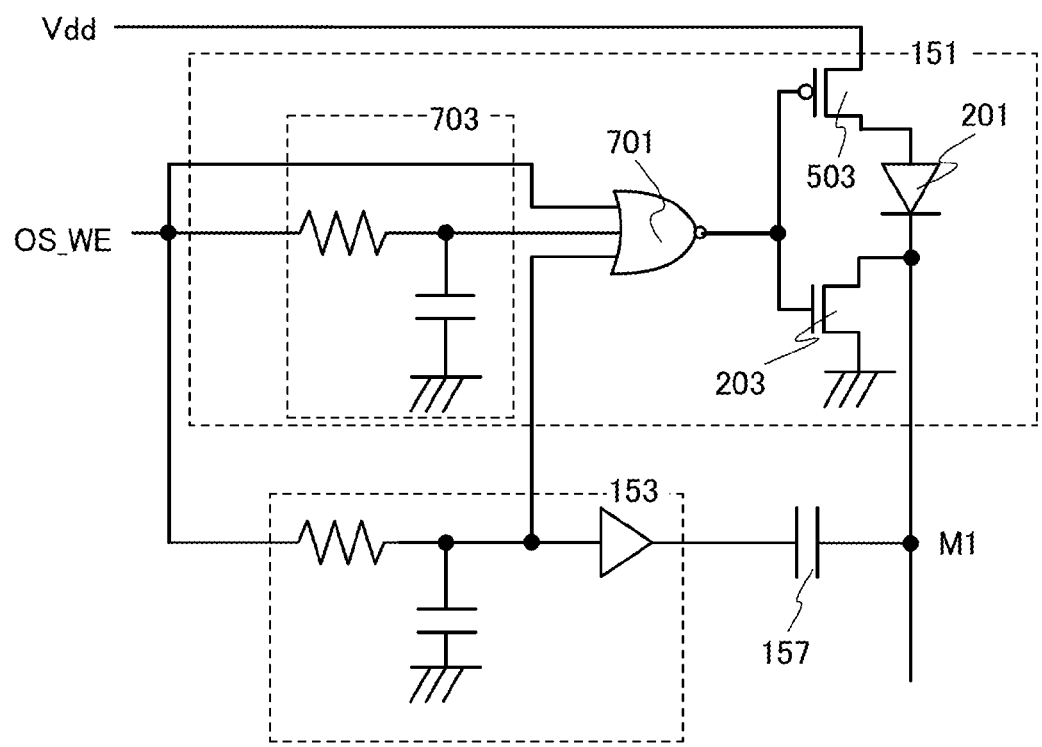
FIG. 6 illustrates part of a memory device according to an embodiment of the present invention.

FIG. 6 illustrates a controller circuit having a different structure.

As compared to the controller in FIG. 5, the controller in FIG. 6 includes a NOR circuit 701 instead of the inverter 202, in which a write signal is input to the first switching transistor 203 and the second switching transistor 503 through the NOR circuit 701. Not only the write signal but also a write signal delayed by a delay circuit 703 including a resistor and a capacitor and a write signal delayed by the delay circuit 153 are input to the NOR circuit 701.

The delay circuit 703 has a longer delay time than the delay circuit 153. The time for which the delay circuit delays an input signal can be adjusted by a known adjustment method; however, the delay time of the delay circuit in this embodiment is preferably adjusted by changing the capacitance of the capacitor of the delay circuit. The delay time of the delay circuit can also be changed by changing the resistance of the resistor; however, the method for adjusting the delay time by changing the capacitance can more stably adjust the delay time of the circuit.

The NOR circuit 701 outputs an L-level signal when at least one of three signals input to the NOR circuit 701 is an H-level signal. That is, when at least one of the signals is an H-level signal, the second switching transistor 503 is on to electrically connect the first node to the power supply.

As described in Embodiment 1, when the delayed write signal is input to the first capacitor 157 from the delay circuit 153, the potential at the first node (M1) increases due to capacitive coupling. At this time, in order to turn on the first transistor 159 having the gate electrode connected to the first node, the first node needs to hold charge corresponding to the power supply potential, in other words, not the ground potential but the power supply potential needs to be input to the first node.

As in the circuit illustrated in FIG. 6, the period in which the NOR circuit outputs L-level signal can be prolonged by not only inputting the write signal OS_WE directly but also by inputting the write signal delayed by the delay circuit 153 and the write signal delayed by the delay circuit 703 to the NOR circuit 701. Since, when the signal delayed by the delay circuit 153 is input to the first capacitor 157, at least any one of these signals is input to the NOR circuit 701, the power supply potential can be input certainly to the first node when the signal delayed by the delay circuit 153 is input to the first capacitor 157.

Further, with the structure in which the delay circuit 703 having a longer delay time than the delay circuit 153 is provided, a signal can be input to the NOR circuit 701 also after the signal from the delay circuit 153 is input to the first capacitor 157. Accordingly, the first transistor 159 can be definitely turned on due to the increase in potential by the capacitive coupling and data can be written to the memory device.

The controllers described in this embodiment include more switching transistors than the controller described in Embodiment 1 and enable disconnection between the first node M1 and the power supply during a period in which a potential is not input from the power supply. Accordingly, a memory device including any of the controllers described in this embodiment has lower power consumption than the memory device described in Embodiment 1.

In this embodiment, by using a plurality of delay circuits, it is possible to prolong the period for which the signals including the signals delayed by the delay circuits 153 and 703 are input to the NOR circuit 701. Therefore, the period for which the power supply potential is input to the first transistor 159 can be extended, which allows the power supply potential to be definitely input to the first transistor 159 until the bootstrap operation is completed.

This embodiment can be combined with any of the other embodiments as appropriate.

(Embodiment 3)

In this embodiment, a transistor in which a channel is formed in an oxide semiconductor layer, which is used in the memory device (nonvolatile random access memory) described in the above embodiment, will be described. First, an oxide semiconductor will be described below in detail.

An oxide semiconductor contains at least one element selected from In, Ga, Sn, and Zn. As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as a Sn—Ga—Zn-based oxide, an Al—Ga—Zn-based oxide, a Sn—Al—Zn-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is close to the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is close to the above compositions may be used.

However, the composition is not limited to those described above, and a material having an appropriate composition may be used depending on required semiconductor characteristics (e.g., mobility, threshold voltage, and variation). In order to obtain required semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is close to the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, a mobility higher than that of an oxide semiconductor in an amorphous state can be obtained. In order to improve the surface flatness, the oxide semiconductor is preferably formed over a flat surface. Specifically, the oxide semiconductor is preferably formed over a surface with an average surface roughness ($R_\alpha$) of less than or equal to 1 nm, preferably less than or equal to 0.3 nm.

Note that the average surface roughness ($R_\alpha$) is obtained by expanding, into three dimensions, center line average roughness that is defined by JIS B 0601 so as to be able to apply it to a surface. $R_\alpha$ can be expressed as an "average value of the absolute values of deviations from a reference surface to a designated surface" and is defined by the following Formula (1).

[FORMULA 1]

$$Ra = \frac{1}{S_0} \int_{y_1}^{y_2} \int_{x_1}^{x_2} |f(x, y) - Z_0| dx dy \qquad (1)$$

In the above formula, $S_0$ represents the area of a plane to be measured (a quadrangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

Here, a CAAC-OS (c-axis aligned crystalline oxide semiconductor) film, which is an embodiment of a crystal structure of oxide semiconductor, will be described.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface over which the CAAC-OS film is formed or a normal vector of a top surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the case where crystal growth occurs from a surface side of the oxide semiconductor film, the proportion of crystal parts in the vicinity of the top surface of the oxide semiconductor layer is higher than that in the vicinity of the surface over which the oxide semiconductor layer is formed in some cases. Further, when an impurity or the like is added to the CAAC-OS film, the crystal part becomes amorphous in some cases.

Since the c-axes of the crystal parts included in the CAAC-OS film are aligned in the direction parallel to a normal vector of a surface over which the CAAC-OS film is formed or a normal vector of a top surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). The crystal part is formed by film formation or by performing treatment for crystallization such as heat treatment after film formation.

With the use of the CAAC-OS film, change in electric characteristics of the transistor due to irradiation with visible light or ultraviolet light can be reduced. Thus, a transistor with high reliability can be formed.

Next, a crystal structure of the CAAC-OS film will be described in detail with reference to FIGS. 7A to 7E, FIGS. 8A to 8C, and FIGS. 9A to 9C. In FIGS. 7A to 7E, FIGS. 8A to 8C, and FIGS. 9A to 9C, the vertical direction corresponds to the c-axis direction and a plane perpendicular to the c-axis direction corresponds to the a-b plane.

In this embodiment, the expressions an "upper half" and a "lower half" refer to an upper half above the a-b plane and a lower half below the a-b plane, respectively. Furthermore, in FIGS. 7A to 7E, O surrounded by a circle represents tetracoordinate O and a double circle represents tricoordinate O.

Figure 7A:
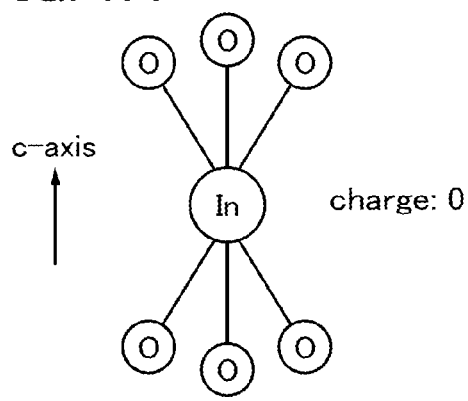
FIGS. 7A to 7E show crystal structures of oxide materials.

FIG. 7A illustrates a structure A including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure A is actually an octahedral structure, but is illustrated as a planar structure for simplicity. Note that three tetracoordinate O atoms exist in each of an upper half and a lower half in the structure A. In the small group of the structure A, electric charge is 0.

Figure 7D:
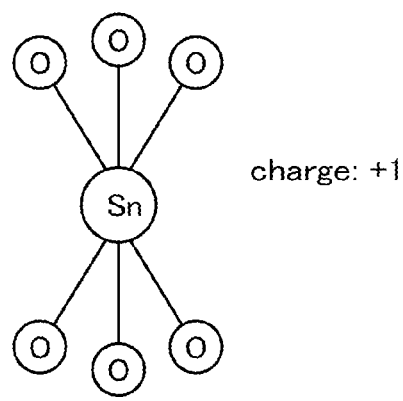
Figure 7B:
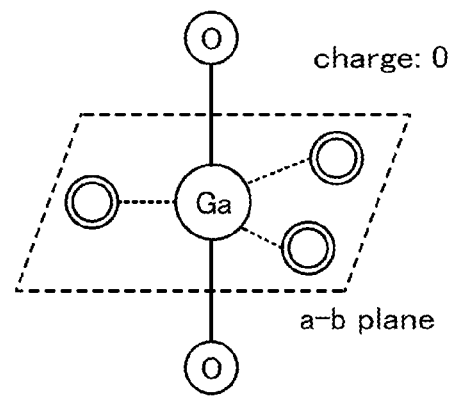

FIG. 7B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in the structure B. An In atom can also have the structure B because an In atom can have five ligands. In the small group of the structure B, electric charge is 0.

Figure 7E:
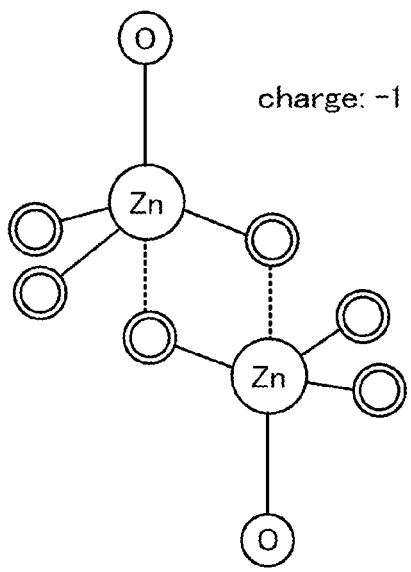
Figure 7C:
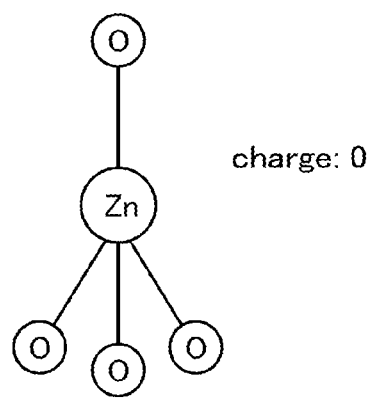

FIG. 7C illustrates a structure C including one tetracoordinate Zn atom and four tetracoordinate O atoms proximate to the Zn atom. In the structure C, one tetracoordinate O atom exists in an upper half and three tetracoordinate O atoms exist in a lower half. Alternatively, three tetracoordinate O atoms may exist in the upper half and one tetracoordinate O atom may exist in the lower half in the structure C. In the small group of the structure C, electric charge is 0.

FIG. 7D illustrates a structure D including one hexacoordinate Sn atom and six tetracoordinate O atoms proximate to the Sn atom. In the structure D, three tetracoordinate O atoms exist in each of an upper half and a lower half. In the small group of the structure D, electric charge is +1.

FIG. 7E illustrates a structure E including two Zn atoms. In the structure E, one tetracoordinate O atom exists in each of an upper half and a lower half In the small group of the structure E, electric charge is −1.

In this embodiment, a plurality of small groups form a medium group, and a plurality of medium groups form a large group (also referred to as a unit cell).

Now, a rule of bonding between the small groups will be described.

The three O atoms in the upper half with respect to the hexacoordinate In atom in FIG. 7A each have three proximate In atoms in the downward direction, and the three O atoms in the lower half each have three proximate In atoms in the upward direction. The one O atom in the upper half with respect to the pentacoordinate Ga atom in FIG. 7B has one proximate Ga atom in the downward direction, and the one O atom in the lower half has one proximate Ga atom in the upward direction. The one O atom in the upper half with respect to the tetracoordinate Zn atom in FIG. 7C has one proximate Zn atom in the downward direction, and the three O atoms in the lower half each have three proximate Zn atoms in the upward direction.

In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms.

Since the coordination number of the tetracoordinate O atom is 4, the sum of the number of the metal atoms proximate to and below the O atom and the number of the metal atoms proximate to and above the O atom is 4.

Accordingly, when the sum of the number of tetracoordinate O atoms above a metal atom and the number of tetracoordinate O atoms below another metal atom is 4, the two kinds of small groups including the metal atoms can be bonded.

For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 8A:
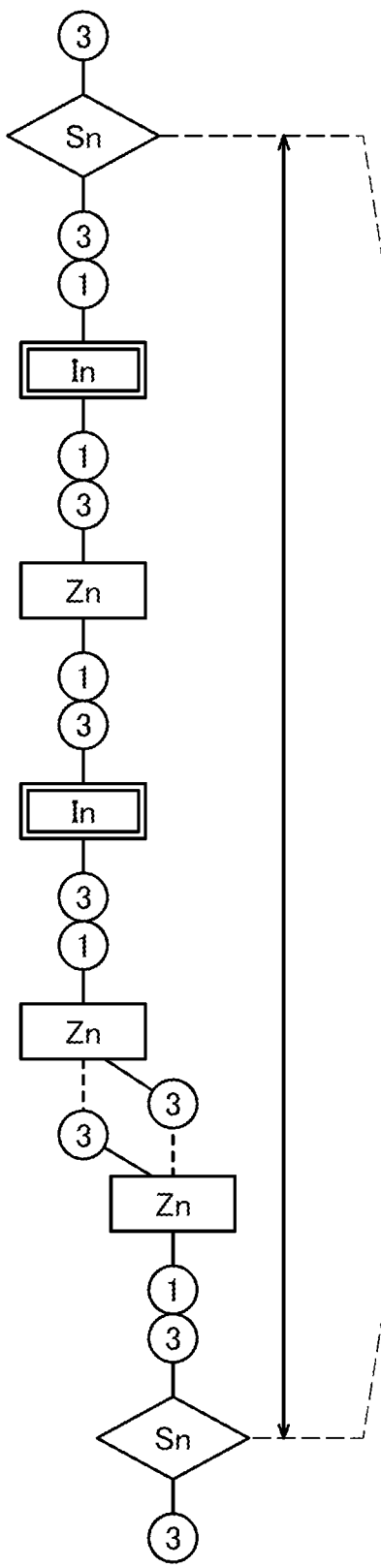
FIGS. 8A to 8C show a crystal structure of an oxide material.
Figure 8B:
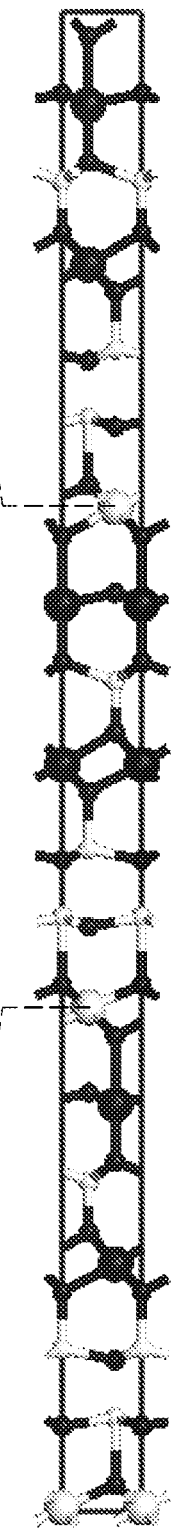

FIG. 8A illustrates a model of a medium group A included in a layered structure of an In—Sn—Zn—O-based material. FIG. 8B illustrates a large group B including three medium groups.

Figure 8C:
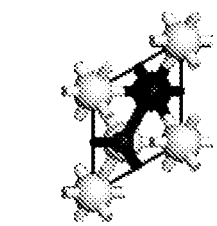

Note that FIG. 8C illustrates an atomic arrangement in the case where the layered structure in FIG. 8B is observed from the c-axis direction.

In the medium group A, a tricoordinate O atom is omitted, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in the medium group A, one tetracoordinate O atom existing in each of an upper half and a lower half with respect to an In atom is denoted by circled 1.

The medium group A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group A included in the layered structure of the In—Sn—Zn—O-based material, in the order starting from the top, a Sn atom proximate to three tetracoordinate O atoms in each of an upper half and a lower half is bonded to an In atom, through an tetracoordinate O atom, proximate to one tetracoordinate O atom in each of an upper half and a lower half. Note that among total 4 tetracoordinate O atoms between the Sn atom and the In atom, which are illustrated by the circled 1 and circled 3, one tetracoordinate O atom is shared by the Sn atom and the In atom. The same is applied to the other metal-oxygen-metal bonds.

The In atom is bonded to a Zn atom, through one tetracoordinate O atom, proximate to three tetracoordinate O atoms in an upper half. The Zn atom is bonded to an In atom proximate to three tetracoordinate O atoms in each of an upper half and a lower half through one tetracoordinate O atom in a lower half with respect to the Zn atom. The In atom is bonded to a small group that includes two Zn atoms and is proximate to one tetracoordinate O atom in an upper half through one tetracoordinate O atoms.

This Zn-containing small group is bonded to a Sn atom proximate to three tetracoordinate O atoms in each of an upper half and a lower half through one tetracoordinate O atom in a lower half with respect to the small group. A plurality of such medium groups are bonded, so that a large group is formed. Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom.

As a structure having electric charge of −1, the small group including two Zn atoms as illustrated in the structure E can be given. For example, with one small group including two Zn atoms, electric charge of one small group including a Sn atom can be cancelled, so that the total electric charge of the layered structure can be 0.

When the large group B is repeated, an In—Sn—Zn—O-based crystal ($In_2SnZn_3O_8$) can be obtained.

Note that a layered structure of the obtained In—Sn—Zn—O-based crystal can be expressed as a composition formula, $In_2SnZn_2O_7(ZnO)_m$ (m is 0 or a natural number).

The same applies to the case where an oxide semiconductor other than the In—Sn—Zn—O-based material is used.

Figure 9A:
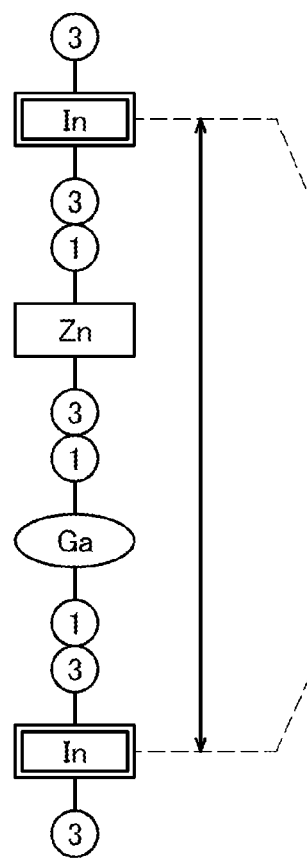
FIGS. 9A to 9C show a crystal structure of an oxide material.

As an example, FIG. 9A illustrates a model of a medium group L included in a layered structure of an In—Ga—Zn—O-based material.

In the medium group L included in the layered structure of the In—Ga—Zn—O-based material, in the order starting from the top, an In atom proximate to three tetracoordinate O atoms in each of an upper half and a lower half is bonded to a Zn atom proximate to one tetracoordinate O atom in an upper half through one tetracoordinate O atom.

The Zn atom is bonded to a Ga atom proximate to one tetracoordinate O atom in each of an upper half and a lower half through three tetracoordinate O atoms in a lower half with respect to the Zn atom. The Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 9B:
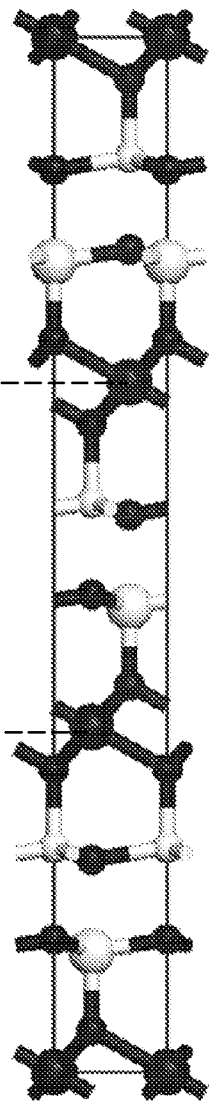

FIG. 9B illustrates a large group M including three medium groups.

Figure 9C:
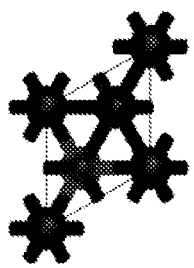

Note that FIG. 9C illustrates an atomic arrangement in the case where the layered structure in FIG. 9B is observed from the c-axis direction. Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0.

As a result, the total electric charge of a medium group having a combination of such small groups is always 0. In order to form the layered structure of the In—Ga—Zn—O-based material, a large group can be formed using not only the medium group L but also a medium group in which the arrangement of the In atom, the Ga atom, and the Zn atom is different from that of the medium group L.

Figure 10A:
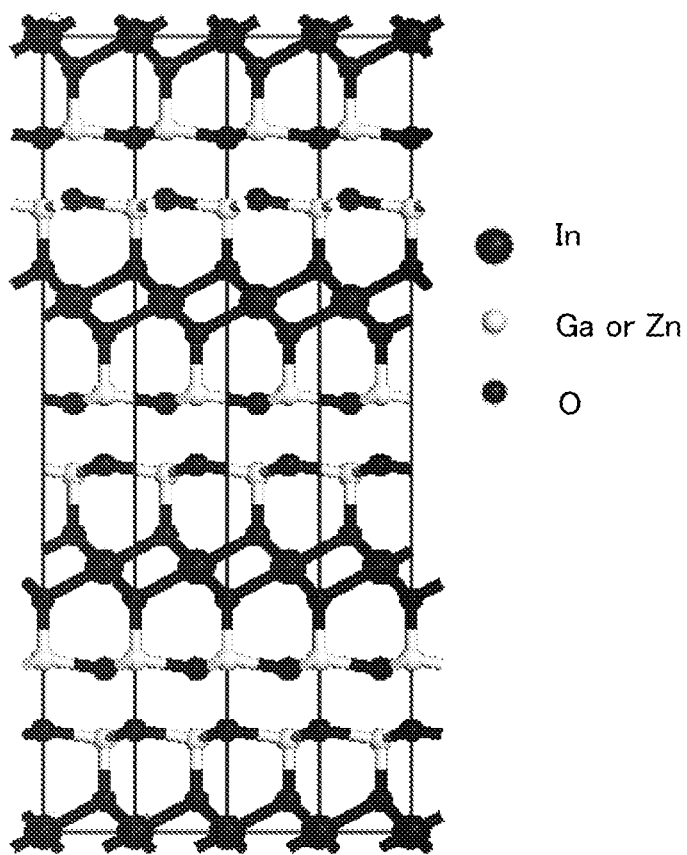
FIGS. 10A and 10B each illustrate a structure of an oxide.

When the large group illustrated in FIG. 9B is repeated, a crystal of an In—Ga—Zn-based oxide can be obtained. Note that a layered structure of the obtained In—Ga—Zn-based oxide can be expressed as a composition formula, InGaO$_3$(ZnO)$_n$ (n is a natural number). In the case where n=1 (InGaZnO$_4$), a crystal structure illustrated in FIG. 10A can be obtained, for example. Note that in the crystal structure in FIG. 10A, since a Ga atom and an In atom each have five ligands as illustrated in FIG. 7B, Ga can be replaced with In.

Figure 10B:
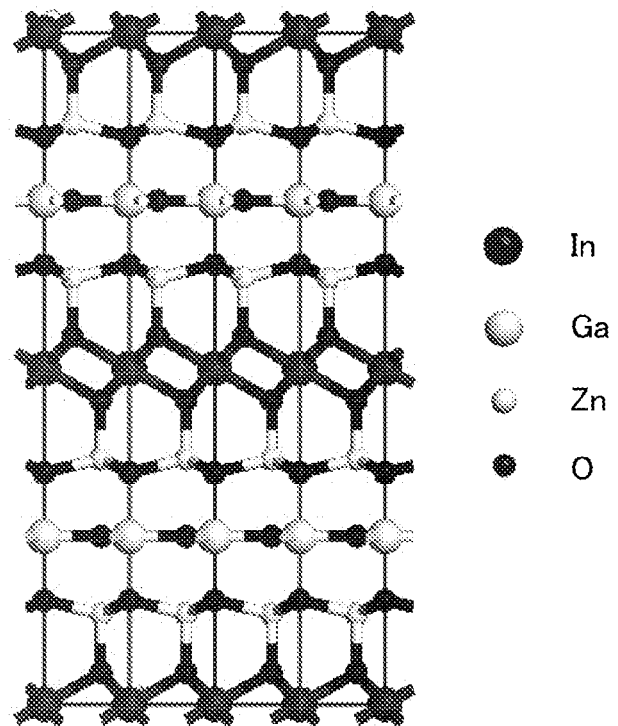

In the case where n=2 (InGaZn$_2$O$_5$), a crystal structure illustrated in FIG. 10B can be obtained, for example. Note that in the crystal structure in FIG. 10B, since a Ga atom and an In atom each have five ligands as described in FIG. 7B, Ga can be replaced with In.

In the case where an In—Zn—O-based material is used as the oxide semiconductor, the atomic ratio thereof is In/Zn=0.5 to 50, preferably In/Zn=1 to 20, further preferably In/Zn=1.5 to 15. When the atomic ratio of Zn is in the above preferred range, the field effect mobility of the above semiconductor element can be improved. Here, when the atomic ratio of the compound is In:Zn:O=X:Y:Z, the relation Z>1.5X+Y is satisfied.

Note that it is preferable that the oxide semiconductor layer be purified by a reduction of impurities such as moisture and hydrogen which serve as electron donors (donors). Specifically, the concentration of hydrogen in the purified oxide semiconductor layer which is measured by secondary ion mass spectrometry (SIMS) is $5\times10^{19}/cm^3$ or lower, preferably $5\times10^{18}/cm^3$ or lower, further preferably $5\times10^{17}/cm^3$ or lower, still further preferably $1\times10^{16}/cm^3$ or lower. The carrier density of the oxide semiconductor layer measured by Hall effect measurement is less than $1\times10^{14}/cm^3$, preferably less than $1\times10^{12}/cm^3$, further preferably less than $1\times10^{11}/cm^3$.

The analysis of the hydrogen concentration in the oxide semiconductor layer is described here. The hydrogen concentration of the semiconductor layer is measured by SIMS. It is known that it is difficult, in principle, to obtain correct data in the proximity of a surface of a sample or in the proximity of an interface between stacked layers formed using different materials by the SIMS analysis. Thus, in the case where the distribution of the concentration of hydrogen in the layer in the thickness direction is analyzed by SIMS, an average value in a region of the layer in which the value is not greatly changed and substantially constant is employed as the hydrogen concentration. Further, in the case where the thickness of the layer is small, a region where almost the constant value is obtained cannot be found in some cases due to the influence of the hydrogen concentration of an adjacent layer. In that case, the maximum value or the minimum value of the hydrogen concentration is employed as the hydrogen concentration of the layer. Moreover, in the case where the maximum value or the minimum value do not exist in the region of the layer, the value at the inflection point is employed as the hydrogen concentration.

When the oxide semiconductor layer is formed by sputtering, it is important to reduce water and hydrogen existing in the chamber as much as possible, in addition to the hydrogen concentration in the target. Specifically, the following are effective: inside of the chamber is baked before the deposition; the water and hydrogen concentrations in a gas introduced in the chamber are reduced; and backflow in an exhaust system, from which a gas in the chamber is exhausted, is prevented.

The oxide semiconductor layer is formed in an oxygen gas atmosphere preferably by a sputtering method. At this time, the substrate heating temperature is set to higher than or equal to 100° C. and lower than or equal to 600° C., preferably higher than or equal to 150° C. and lower than or equal to 550° C., further preferably higher than or equal to 200° C. and lower than or equal to 500° C. The thickness of the oxide semiconductor layer is greater than or equal to 1 nm and less than or equal to 40 nm, preferably greater than or equal to 3 nm and less than or equal to 20 nm. The impurity concentration in the obtained oxide semiconductor layer is decreased with increase in the substrate heating temperature in film formation. Further, the atomic arrangement in the oxide semiconductor layer is ordered, and the density thereof is increased, so that a polycrystal or a CAAC is likely to be formed. When an oxygen gas atmosphere is employed in the absence of rare gas, an unnecessary atom such as a rare gas atom is not contained in the oxide semiconductor layer, so that a polycrystal or a CAAC is likely to be formed. Note that a mixed gas atmosphere including an oxygen gas and a rare gas may be used. In that case, the percentage of an oxygen gas is higher than or equal to 30 vol. %, preferably higher than or equal to 50 vol. %, further preferably higher than or equal to 80 vol. %. Note that as the oxide semiconductor layer is thinner, a short-channel effect of a transistor is reduced. However, when the oxide semiconductor layer is too thin, influence of interface scattering is enhanced; thus, the field effect mobility might be decreased.

In the case of forming a layer of an In—Ga—Zn—O-based material as the oxide semiconductor layer by a sputtering method, it is preferable to use an In—Ga—Zn—O target having the following atomic ratio: the atomic ratio of In:Ga:Zn is 1:1:1, 4:2:3, 3:1:2, 1:1:2, 2:1:3, or 3:1:4. When an oxide semiconductor film is formed using an In—Ga—Zn—O target having the aforementioned atomic ratio, a polycrystal layer or a CAAC-OS layer is easily formed.

In the case of forming a layer of an In—Sn—Zn—O-based material as the oxide semiconductor layer by a sputtering method, it is preferable to use an In—Sn—Zn—O target having the following atomic ratio: the atomic ratio of In:Sn:Zn is 1:1:1, 4:2:3, 3:1:2, 1:1:2, 3:1:4, 2:1:3, 1:2:2, or 20:45:35. When an oxide semiconductor layer is formed using an In—Sn—Zn—O target having the aforementioned atomic ratio, a polycrystal layer or a CAAC-OS layer is easily formed.

Next, heat treatment is performed. The heat treatment is performed in a reduced pressure atmosphere, an inert atmosphere, or an oxidation atmosphere. By the heat treatment, the impurity concentration in the oxide semiconductor layer can be reduced.

The heat treatment is preferably performed in such a manner that after heat treatment is performed in a reduced pressure atmosphere or an inert atmosphere, the atmosphere is switched to an oxidation atmosphere with the temperature maintained and heat treatment is further performed. When the heat treatment is performed in a reduced pressure atmosphere or an inert atmosphere, the impurity concentration in the oxide semiconductor layer can be reduced; however, oxygen vacancies are caused at the same time. By the heat treatment in the oxidation atmosphere, the caused oxygen vacancies can be reduced.

By performing heat treatment on the oxide semiconductor layer in addition to the substrate heating at the time of film formation, the impurity level in the film can be significantly reduced. As a result, the field effect mobility of the transistor can be increased so as to be close to ideal field effect mobility to be described later.

<Transistor Whose Channel is Formed in Oxide Semiconductor Layer>

Transistors whose channel is formed in an oxide semiconductor layer will be described with reference to FIGS. 16A to 16D. FIGS. 16A to 16D are schematic cross-sectional views each illustrating an example of the structure of the transistor.

Figure 16A:
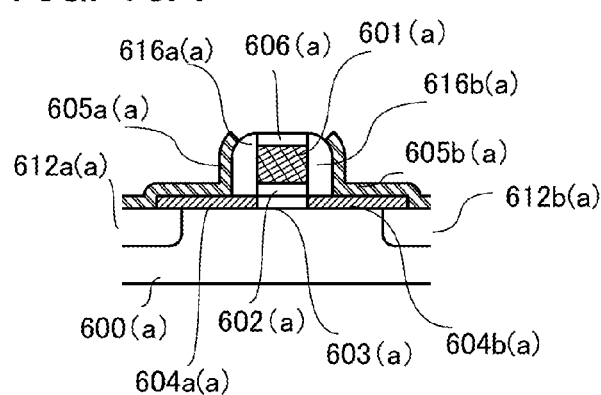
FIGS. 16A to 16D illustrate cross-sectional structures of transistors which are used in an embodiment of the present invention.

The transistor illustrated in FIG. 16A includes a conductive layer 601(a), an insulating layer 602(a), an oxide semiconductor layer 603(a), a conductive layer 605a(a), a conductive layer 605b(a), and an insulating layer 606(a).

The conductive layer 601(a) is provided over an element formation layer 600(a). An embedded insulator 612a(a) and an embedded insulator 612b(a) are embedded in the element formation layer 600(a).

The insulating layer 602(a) is provided under the conductive layer 601(a).

The oxide semiconductor layer 603(a) overlaps with the conductive layer 601(a) with the insulating layer 602(a) provided therebetween. The oxide semiconductor layer 603(a) includes a region 604a(a) and a region 604b(a). The region 604a(a) and the region 604b(a) are positioned apart from each other, and are regions to which a dopant is added. A region between the region 604a(a) and the region 604b(a) serves as a channel formation region. The region 604a(a) overlaps with the conductive layer 605a(a) and an insulating layer 616a(a), and the region 604b(a) overlaps with the conductive layer 605b(a) and an insulating layer 616b(a).

The conductive layer 605a(a) and the conductive layer 605b(a) overlap with the oxide semiconductor layer 603(a) and are electrically connected to the oxide semiconductor layer 603(a).

The insulating layer 606(a) is provided over the oxide semiconductor layer 603(a), the insulating layer 602(a), and the conductive layer 601(a).

Figure 16C:
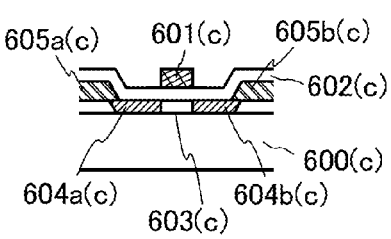
Figure 16B:
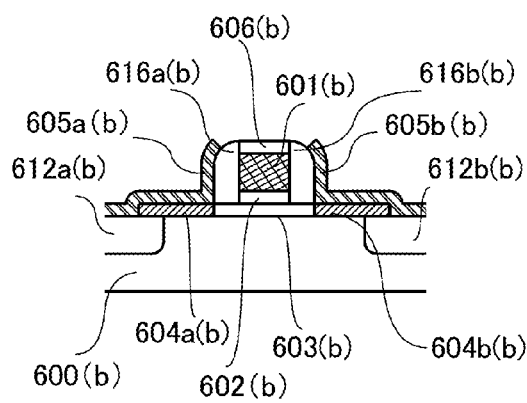

The transistor illustrated in FIG. 16B includes a conductive layer 601(b), an insulating layer 602(b), an oxide semiconductor layer 603(b), a conductive layer 605a(b), a conductive layer 605b(b), and an insulating layer 606(b).

The conductive layer 601(b) is provided over an element formation layer 600(b). An embedded insulator 612a(b) and an embedded insulator 612b(b) are embedded in the element formation layer 600(a).

The insulating layer 602(b) is provided under the conductive layer 601(b).

The conductive layer 605a(b) and the conductive layer 605b(b) are each provided over the oxide semiconductor layer 603(b). The oxide semiconductor layer 603(b) includes a region 604a(b) and a region 604b(b). The region 604a(b) and the region 604b(b) are positioned apart from each other, and are regions to which a dopant is added. A region between the region 604a(b) and the region 604b(b) serves as a channel formation region. The region 604a(b) overlaps with the conductive layer 605a(b), and the region 604b(b) overlaps with the conductive layer 605b(b).

The oxide semiconductor layer 603(b) is electrically connected to the conductive layer 605a(b) and the conductive layer 605b(b). The oxide semiconductor layer 603(b) overlaps with the conductive layer 601(b) with the insulating layer 602(b) provided therebetween.

The insulating layer 606(b) is provided over the conductive layer 601(b).

The transistor illustrated in FIG. 16C includes a conductive layer 601(c), an insulating layer 602(c), an oxide semiconductor layer 603(c), a conductive layer 605a(c), and a conductive layer 605b(c).

The oxide semiconductor layer 603(c) includes a region 604a(c) and a region 604b(c). The region 604a(c) and the region 604b(c) are provided apart from each other, and are regions to which a dopant is added. A region between the region 604a(c) and the region 604b(c) serves as a channel formation region. The oxide semiconductor layer 603(c) is provided over an element formation layer 600(c). The region 604a(c) and the region 604b(c) are not necessarily provided.

The conductive layer 605a(c) and the conductive layer 605b(c) are provided over and electrically connected to the oxide semiconductor layer 603(c). The side surfaces of the conductive layer 605a(c) and the conductive layer 605b(c), which face to each other, are tapered.

The conductive layer 605a(c) overlaps part of the region 604a(c); however, the present invention is not necessarily limited to this structure. When the conductive layer 605a(c) overlaps part of the region 604a(c), the resistance between the conductive layer 605a(c) and the region 604a(c) can be low. Alternatively, the region 604a(c) may be entirely overlapped with the conductive layer 605a(c).

The conductive layer 605b(c) overlaps with part of the region 604b(c); however, this embodiment is not limited thereto. When the conductive layer 605b(c) overlaps with part of the region 604b(c), the resistance between the conductive layer 605b(c) and the region 604b(c) can be low. Alternatively, the region 604b(c) may be entirely overlapped with the conductive layer 605b(c).

The insulating layer 602(c) is provided over the oxide semiconductor layer 603(c), the conductive layer 605a(c), and the conductive layer 605b(c).

The conductive layer 601(c) overlaps with the oxide semiconductor layer 603(c) with the insulating layer 602(c) provided therebetween. A region of the oxide semiconductor layer 603(c) which overlaps with the conductive layer 601(c) with the insulating layer 602(c) provided therebetween serves as a channel formation region.

Figure 16D:
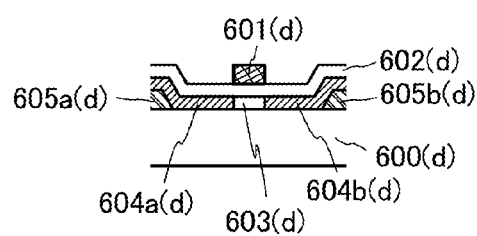

The transistor illustrated in FIG. 16D includes a conductive layer 601(d), an insulating layer 602(d), an oxide semiconductor layer 603(d), a conductive layer 605a(d), and a conductive layer 605b(d).

The conductive layer 605a(d) and the conductive layer 605b(d) are provided over an element formation layer 600(d). The side surfaces of the conductive layers 605a(d) and 605b(d), which face to each other, are tapered.

The oxide semiconductor layer 603(d) includes a region 604a(d) and a region 604b(d). The region 604a(d) and the region 604b(d) are provided apart from each other, and are regions to which a dopant is added. A region between the region 604a(d) and the region 604b(d) serves as a channel formation region. The oxide semiconductor layer 603(d) is provided over the conductive layer 605a(d), the conductive layer 605b(d), and the element formation layer 600(d), and is electrically connected to the conductive layer 605a(d) and the conductive layer 605b(d). The region 604a(d) and the region 604b(d) are not necessarily provided.

The region 604a(d) is electrically connected to the conductive layer 605a(d).

The region 604b(d) is electrically connected to the conductive layer 605b(d).

The insulating layer 602(d) is provided over the oxide semiconductor layer 603(d).

The conductive layer 601(d) overlaps with the oxide semiconductor layer 603(d) with the insulating layer 602(d) provided therebetween. A region of the oxide semiconductor layer 603(d) which overlaps with the conductive layer 601(d) with the insulating layer 602(d) placed therebetween serves as a channel formation region.

Further, components illustrated in FIGS. 16A to 16D are described.

The element formation layers 600(a) to 600(d) can be insulating layers, substrates having insulating surfaces, or the like, for example. Further, layers over which elements are formed in advance can be used as the element formation layers 600(a) to 600(d).

The conductive layers 601(a) to 601(d) each function as a gate of the transistor. Note that a layer functioning as a gate of the transistor can be called a gate electrode or a gate wiring.

As the conductive layers 601(a) to 601(d), it is possible to use, for example, a layer of a metal such as molybdenum, magnesium, titanium, chromium, tantalum, tungsten, aluminum, copper, neodymium, or scandium or an alloy containing any of these metal materials as a main component. The conductive layers 601(a) to 601(d) can also be formed by stacking layers of these materials.

Each of the insulating layers 602(a) to 602(d) has a function of a gate insulating layer of the transistor.

Each of the insulating layers 602(a) to 602(d) can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. The insulating layers 602(a) to 602(d) can also be formed by stacking these layers.

Among the aforementioned layers, those containing an element that belongs to Group 13 is preferably used. The use of insulating layers containing a Group 13 element leads to a preferable state of the interfaces between the insulating layers and the oxide semiconductor layers.

Other examples of the material containing an element that belongs to Group 13 include gallium oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. An oxygen-excessive material such as a material represented by $Al_2O_x$ (x=3+a, where a is larger than 0 and smaller than 1), $Ga_2O_x$ (x=3+a, where a is larger than 0 and smaller than 1), or $Ga_xAl_{2-x}O_{3+a}$ (x is larger than 0 and smaller than 2 and a is larger than 0 and smaller than 1) may be used.

As a stacked-layer structure for the insulating layers 602(a) to 602(d), stacked two layers containing gallium oxide with different compositions is represented. Alternatively, the insulating layers 602(a) to 602(d) may be formed by stacking an insulating layer including gallium oxide represented by $Ga_2O_x$, and an insulating layer including aluminum oxide represented by $Al_2O_x$.

When the channel length of the transistor is 30 nm, the thickness of each of the oxide semiconductor layers 603(a) to 603(d) may be approximately 5 nm, for example. In this case, if the oxide semiconductor layers 603(a) to 603(d) are CAAC oxide semiconductor layers, a short channel effect in the transistor can be suppressed.

A dopant imparting n-type or p-type conductivity is added to the regions 604a(a) to 604a(d) and the regions 604b(a) to 604b(d), each of which functions as a source or a drain of the transistor. As the dopant, it is possible to use, for example, one or more elements of Group 13 in the periodic table (e.g., boron), of Group 15 in the periodic table (e.g., nitrogen, phosphorus, and arsenic), and of rare gas (e.g., helium, argon, and xenon). Note that a region functioning as a source of the transistor can be called a source region, and a region functioning as a drain of the transistor can be called a drain region.

The addition of the dopant to the regions 604a(a) to 604a(d) and the regions 604b(a) to 604b(d) reduces the contact resistance between the regions 604a(a) to 604a(d) and 604b(a) to 604b(d) and the conductive layers; accordingly, the transistors can be downsized.

The conductive layers 605a(a) to 605a(d) and the conductive layers 605b(a) and 605b(d) each function as a source electrode or a drain electrode of the transistor. Note that the source electrode can be called a source a source wiring, and the drain electrode can be called a drain wiring.

Each of the conductive layers 605a(a) to 605a(d) and the conductive layers 605b(a) to 605b(d) can be, for example, a layer of a metal such as aluminum, magnesium, chromium, copper, tantalum, titanium, molybdenum, or tungsten; or an alloy which contains any of the above metal materials as a main component. For example, each of the conductive layers 605a(a) to 605a(d) and the conductive layers 605b(a) to 605b(d) can be formed using a layer of an alloy containing copper, magnesium, and aluminum. Alternatively, each of the conductive layers 605a(a) to 605a(d) and the conductive layers 605b(a) to 605b(d) can be formed using a stack of layers of these materials. For example, each of the conductive layers 605a(a) to 605a(d) and the conductive layers 605b(a) to 605b(d) can be formed using a stack of a layer of an alloy containing copper, magnesium, and aluminum and a layer containing copper.

Alternatively, each of the conductive layers 605a(a) to 605a(d) and the conductive layers 605b(a) to 605b(d) can be a layer containing a conductive metal oxide. Examples of the conductive metal oxide are indium oxide, tin oxide, zinc oxide, indium oxide-tin oxide, and indium oxide-zinc oxide. Note that silicon oxide may be contained in these conductive metal oxides.

Each of the insulating layers 606(a) and 606(b) can be a layer of a material applicable to the insulating layers 602(a) to 602(d). Alternatively, each of the insulating layers 606(a) and 606(b) may be formed using a stack of layers of materials applicable to the insulating layers 606(a) and 606(b). For example, each of the insulating layers 606(a) and 606(b) may be a silicon oxide layer, an aluminum oxide layer, or the like. For example, the use of an aluminum oxide layer as the insulating layers 606(a) and 606(b) can more effectively prevent impurities (water) from entering the oxide semiconductor layers 603(a) and 603(b) and effectively prevent the oxide semiconductor layers 603(a) and 603(b) from releasing oxygen.

Alternatively, an insulating layer functioning as a channel protective layer may be formed to have a stacked-layer structure of materials that can be used for the insulating layers 602(a) to 602(d).

In addition, base layers may be formed over the element formation layers 600(a) to 600(d) and the transistors may be formed over the base layers. The base layer can be a layer of a material applicable to the insulating layers 602(a) to 602(d), for example. Alternatively, the base layer may be a stack of layers of the materials applicable to the insulating layers 602(a) to 602(d). For example, when the base layer is a stack of an aluminum oxide layer and a silicon oxide layer, oxygen included in the base layer can be prevented from being released through the oxide semiconductor layers 603(a) to 603(d).

When the insulating layers in contact with the oxide semiconductor layers 603(a) to 603(d) contain an excessive amount of oxygen, oxygen is easily supplied to the oxide semiconductor layers 603(a) to 603(d). Thus, oxygen defects in the oxide semiconductor layers 603(a) to 603(d) and at the interface between the insulating layer and each of the oxide semiconductor layers 603(a) to 603(d) can be reduced, which leads to a further reduction in the carrier concentrations of the oxide semiconductor layers 603(a) to 603(d). Even if the oxide semiconductor layers 603(a) to 603(d) are prepared so that an excessive amount of oxygen is contained therein, the insulating layers in contact with the oxide semiconductor layers 603(a) to 603(d) can prevent oxygen from being released from the oxide semiconductor layers 603(a) to 603(d).

Next, a description will be given with reference to FIG. 11 and FIGS. 12A to 12C of theoretical field-effect mobility of a transistor whose channel is formed in an oxide semiconductor layer. The actually measured field-effect mobility of an insulated gate transistor can be lower than its theoretical field-effect mobility because of a variety of reasons; this phenomenon occurs not only in the case of using oxide semiconductors.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that a potential barrier (such as a grain boundary) exists in a semiconductor, the measured field-effect mobility µ is expressed as the following Formula (2).

[FORMULA 2]

$$\mu = \mu_0 \exp\left(-\frac{E}{kT}\right) \qquad (2)$$

Here, $\mu_0$ represents the theoretical mobility of a semiconductor, E represents the height of the potential barrier, k represents the Boltzmann constant, and T represents the absolute temperature.

When the potential barrier is assumed to be attributed to a defect, the height of the potential barrier is expressed as the following Formula (3) according to the Levinson model.

[FORMULA 3]

$$E = \frac{e^2 N^2}{8\varepsilon n} = \frac{e^3 N^2 t}{8\varepsilon C_{ox} V_g} \qquad (3)$$

Here, e represents the elementary charge, N represents the average defect density per unit area in a channel, $\varepsilon$ represents the permittivity of the semiconductor, n represents the carrier density per unit area in the channel, $C_{ox}$ represents the capacitance per unit area, $V_g$ represents the gate voltage, and t represents the thickness of the channel. In the case where the thickness of the oxide semiconductor layer is less than or equal to 30 nm, the thickness of the channel can be regarded as being the same as the thickness of the oxide semiconductor layer.

The drain current $I_d$ in a linear region is expressed as the following Formula (4).

[FORMULA 4]

$$I_d = \frac{W\mu V_g V_d C_{ox}}{L} \exp\left(-\frac{E}{kT}\right) \qquad (4)$$

Here, L represents the channel length and W represents the channel width, and L and W are each 10 µm. In addition, $V_d$ represents the drain voltage.

When dividing both sides of the above Formula (4) by $V_g$ and then taking logarithms of both sides, the following Formula (5) is obtained.

[FORMULA 5]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \qquad (5)$$

The right side of Formula 5 is a function of $V_g$. From the formula, it is found that the defect density N can be obtained from the slope of a plot of the actually measured values against $\ln(I_d/V_g)$ as the ordinate and $1/V_g$ as the abscissa. That is, the defect density can be evaluated from the $I_d$-$V_g$ characteristics of the transistor.

As a result, the defect density N of an oxide semiconductor in which the ratio of indium (In) to tin (Sn) and zinc (Zn) is 1:1:1 was found to be approximately $1 \times 10^{12}/cm^2$.

On the basis of the defect density obtained in this manner, $\mu_0$ was calculated to be 120 cm²/Vs from Formula 2 and Formula 3, which gives likelihood that the mobility of the ideal oxide semiconductor is 120 cm²/Vs if no defect exists inside the semiconductor and at the interface between the semiconductor and an insulating film. The measured mobility of an In—Sn—Zn oxide including a defect was approximately 40 cm²/Vs.

Note that even when no defect exists inside an oxide semiconductor layer, scattering at an interface between a channel and a gate insulating layer affects the transport property of the transistor. In other words, the mobility $\mu_1$ at a position that is distance x away from the interface between the channel and the gate insulating layer is expressed as the following Formula (6).

[FORMULA 6]

$$\frac{1}{\mu_1} = \frac{1}{\mu_0} + \frac{D}{B}\exp\left(-\frac{x}{l}\right) \qquad (6)$$

Here, D represents the electric field in the gate direction, and B and l are constants. B and l can be obtained from actual measurement results; according to the above measurement results, B was $4.75 \times 10^7$ cm/s and l was 10 nm (the depth to which the influence of interface scattering reaches). When D is increased (i.e., when the gate voltage is increased), the second term of Formula 6 is increased and accordingly the mobility $\mu_1$ is decreased.

Figure 11:
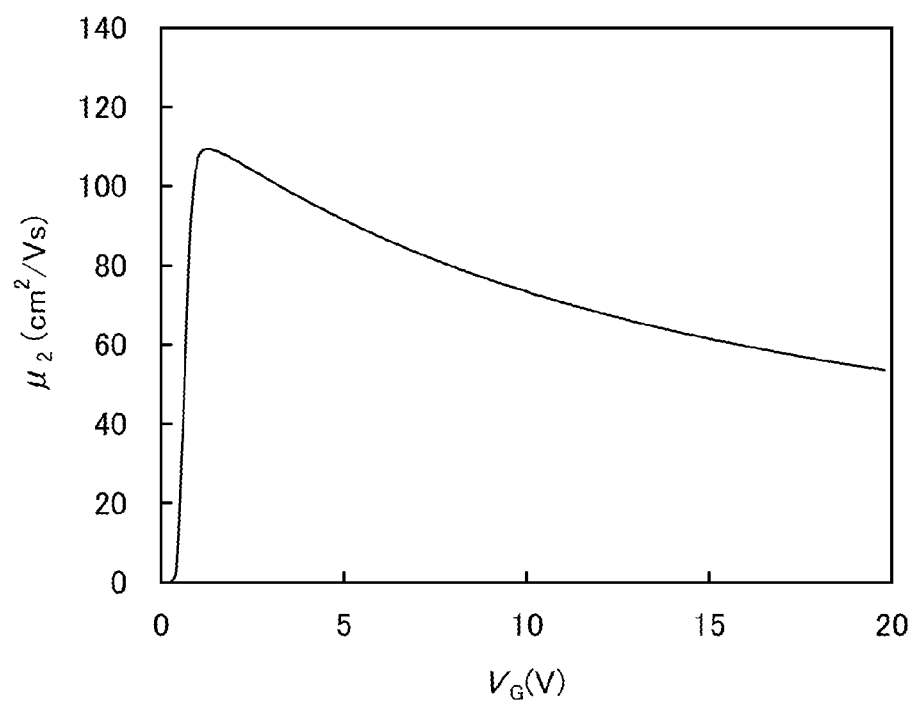
FIG. 11 shows the gate voltage dependence of mobility obtained by calculation.

Calculation results of the mobility $\mu_2$ of a transistor whose channel includes an ideal oxide semiconductor without a defect inside the oxide semiconductor layer are shown in FIG. 11. For the calculation, device simulation software manufactured by Synopsys, Inc., Sentaurus Device, was used, and the bandgap, the electron affinity, the relative permittivity, and the thickness of the oxide semiconductor were assumed to be 2.8 eV, 4.7 eV, 15, and 15 nm, respectively. The work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 µm, and the drain voltage $V_d$ was assumed to be 0.1 V.

As shown in FIG. 11, the mobility has a peak of more than 100 cm²/Vs at a gate voltage that is slightly over 1 V and is decreased with increasing gate voltage because the influence of interface scattering is increased. Note that in order to reduce interface scattering, it is desirable that a surface of the semiconductor layer be flat at the atomic level (atomic layer flatness).

Calculation results of characteristics of minute transistors with an oxide semiconductor having such a mobility are shown in FIGS. 12A to 12C, FIGS. 13A to 13C, and FIGS. 14A to 14C. FIGS. 15A and 15B illustrate cross-sectional structures of the transistors used for the calculation. The transistors illustrated in FIGS. 15A and 15B each include a semiconductor region 103a and a semiconductor region 103c which have n$^+$-type conductivity in an oxide semiconductor layer. The resistivities of the semiconductor region 103a and the semiconductor region 103c are $2\times10^{-3}$ Ωcm.

The transistor illustrated in FIG. 15A is formed over a base insulator 101 and an embedded insulator 102 which is embedded in the base insulator 101 and formed of aluminum oxide. The transistor includes the semiconductor region 103a, the semiconductor region 103c, an intrinsic semiconductor region 103b serving as a channel formation region therebetween, and a gate 105. The width of the gate 105 is 33 nm.

A gate insulator 104 is formed between the gate 105 and the semiconductor region 103b. In addition, a sidewall insulator 106a and a sidewall insulator 106b are formed on both side surfaces of the gate 105, and an insulator 107 is formed over the gate 105 so as to prevent a short circuit between the gate 105 and another wiring. The sidewall insulator has a width of 5 nm. A source 108a and a drain 108b are provided in contact with the semiconductor region 103a and the semiconductor region 103c, respectively. Note that the channel width of this transistor is 40 nm.

The transistor of FIG. 15B is the same as the transistor of FIG. 15A in that it is formed over the base insulator 101 and the embedded insulator 102 formed of aluminum oxide and that it includes the semiconductor region 103a, the semiconductor region 103c, the intrinsic semiconductor region 103b provided therebetween, the gate 105 having a width of 33 nm, the gate insulator 104, the sidewall insulator 106a, the sidewall insulator 106b, the insulator 107, the source 108a, and the drain 108b.

The transistor illustrated in FIG. 15A is different from the transistor illustrated in FIG. 15B in the conductivity type of semiconductor regions under the sidewall insulator 106a and the sidewall insulator 106b. In the transistor illustrated in FIG. 15A, the semiconductor regions under the sidewall insulator 106a and the sidewall insulator 106b are part of the semiconductor region 103a having n$^+$-type conductivity and part of the semiconductor region 103c having n$^+$-type conductivity, whereas in the transistor illustrated in FIG. 15B, the semiconductor regions under the sidewall insulator 106a and the sidewall insulator 106b are part of the intrinsic semiconductor region 103b. In other words, in the semiconductor layer of FIG. 15B, a region having a width of $L_{off}$, which does not overlap with the gate 105, is provided in the intrinsic semiconductor region 103b. This region is called an offset region, and the width $L_{off}$ is called an offset length. As is seen from FIG. 15B, the offset length is equal to the width of the sidewall insulator 106a (the sidewall insulator 106b).

Figure 12A:
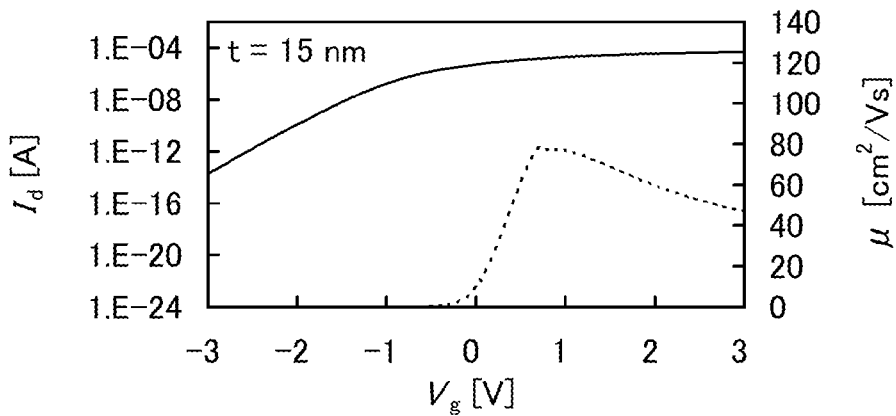
FIGS. 12A to 12C show the gate voltage dependence of drain current and mobility obtained by calculation.
Figure 12B:
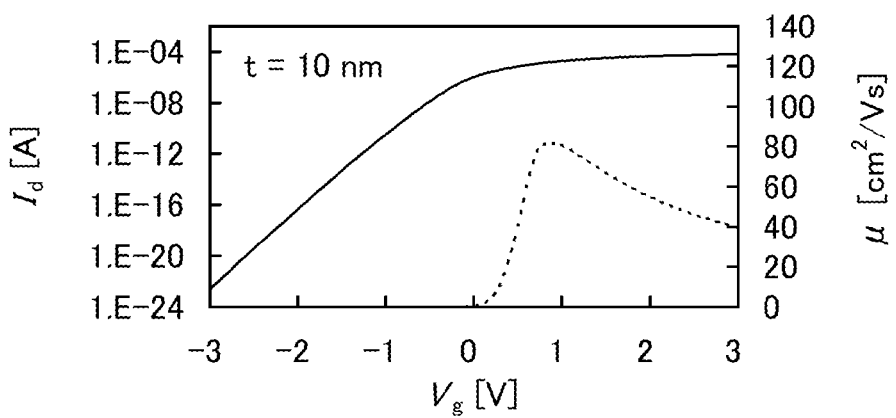
Figure 12C:
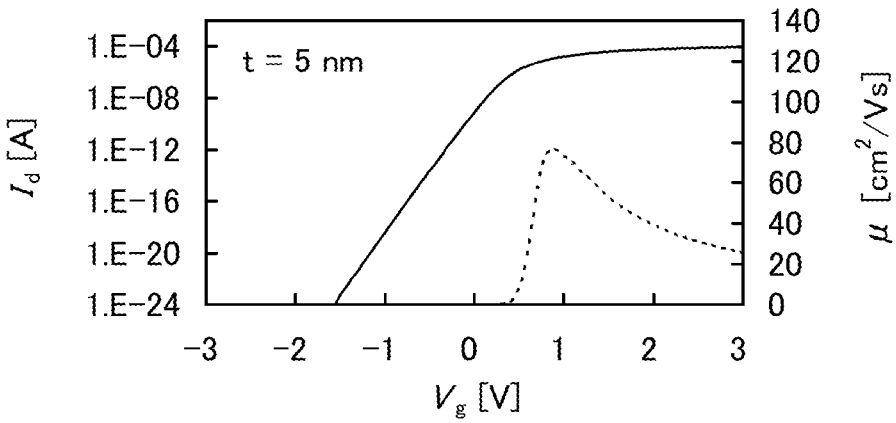

The other parameters used in calculation are as described above. For the calculation, device simulation software manufactured by Synopsys, Inc., Sentaurus Device, was used. FIGS. 12A to 12C show the gate voltage ($V_g$: a potential difference between the gate and the source) dependence of the drain current ($I_d$, a solid line) and the mobility (μ, a dotted line) of the transistor having the structure illustrated in FIG. 15A. The drain current $I_d$ was obtained by calculation under the assumption that the drain voltage (a potential difference between the drain and the source) was +1 V and the mobility μ is obtained by calculation under the assumption that the drain voltage was +0.1 V.

FIG. 12A shows the gate voltage dependence of the transistor in the case where the thickness of the gate insulating film is 15 nm, FIG. 12B shows that of the transistor in the case where the thickness of the gate insulating film is 10 nm, and FIG. 12C shows that of the transistor in the case where the thickness of the gate insulating film is 5 nm. As the gate insulating layer is thinner, the drain current $I_d$ (off-state current) particularly in an off state is significantly decreased. In contrast, there is negligible change in the peak value of the mobility μ and the drain current $I_d$ in an on state (on-state current). The graphs show that the drain current exceeds 10 μA, which is required in a memory element and the like, at a gate voltage of around 1 V.

Figure 13A:
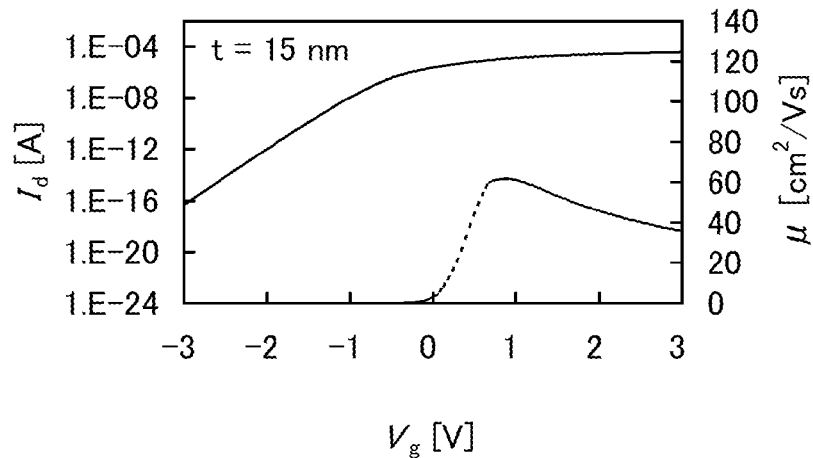
FIGS. 13A to 13C show the gate voltage dependence of drain current and mobility obtained by calculation.
Figure 13B:
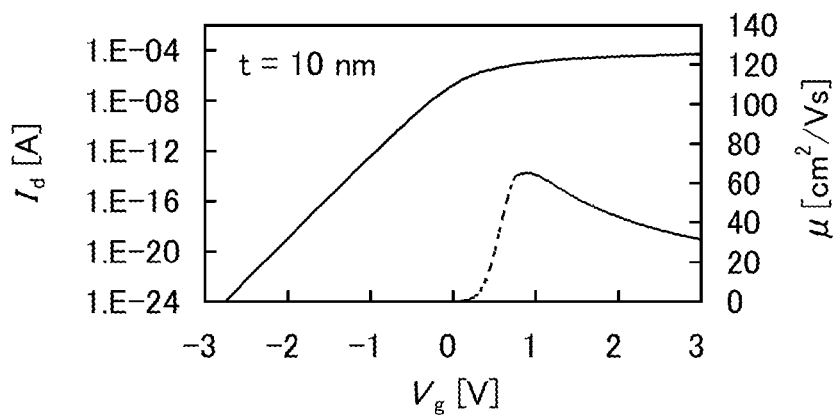
Figure 13C:
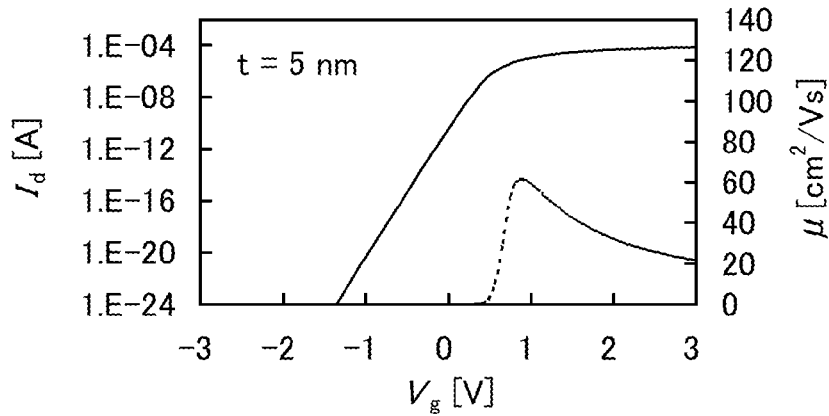

FIGS. 13A to 13C show the gate voltage $V_g$ dependence of the drain current $I_d$ (a solid line) and the mobility μ (a dotted line) of the transistor having the structure illustrated in FIG. 15B where the offset length $L_{off}$ is 5 nm. The drain current $I_d$ was obtained by calculation under the assumption that the drain voltage was +1 V and the mobility μ was obtained by calculation under the assumption that the drain voltage was +0.1 V. FIG. 13A shows the gate voltage dependence of the transistor in the case where the thickness of the gate insulating film is 15 nm, FIG. 13B shows that of the transistor in the case where the thickness of the gate insulating film is 10 nm, and FIG. 13C shows that of the transistor in the case where the thickness of the gate insulating film is 5 nm.

Figure 14A:
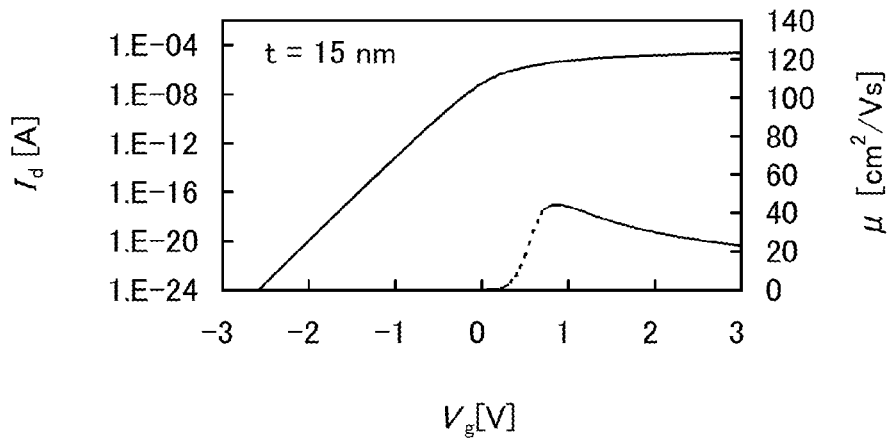
FIGS. 14A to 14C show the gate voltage dependence of drain current and mobility obtained by calculation.
Figure 14B:
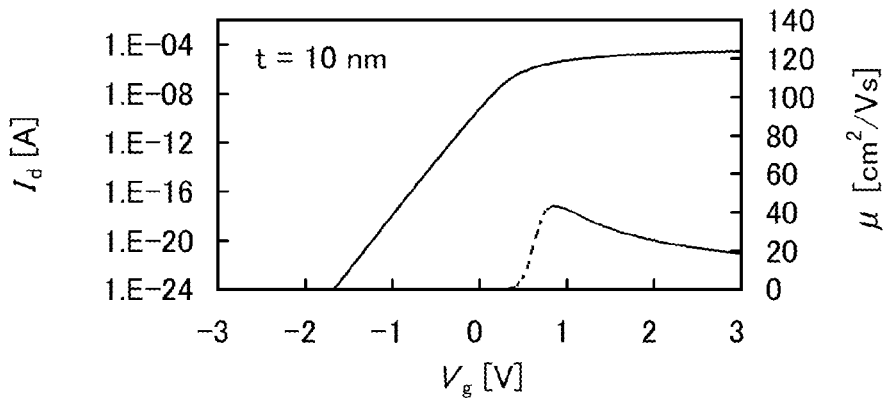
Figure 14C:
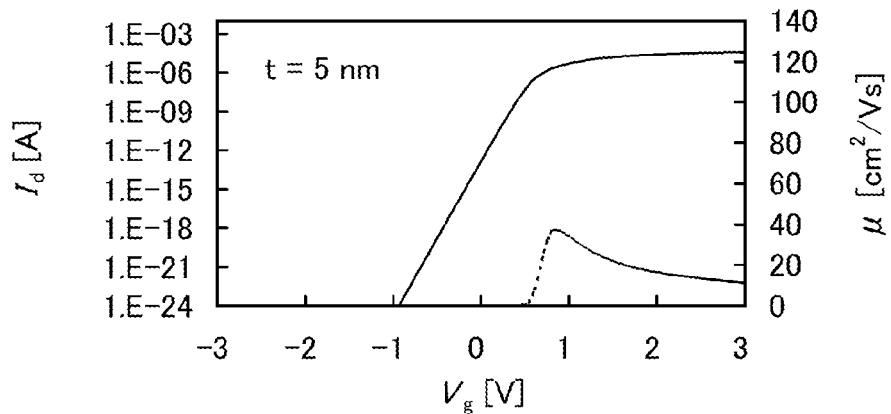
Figure 15A:
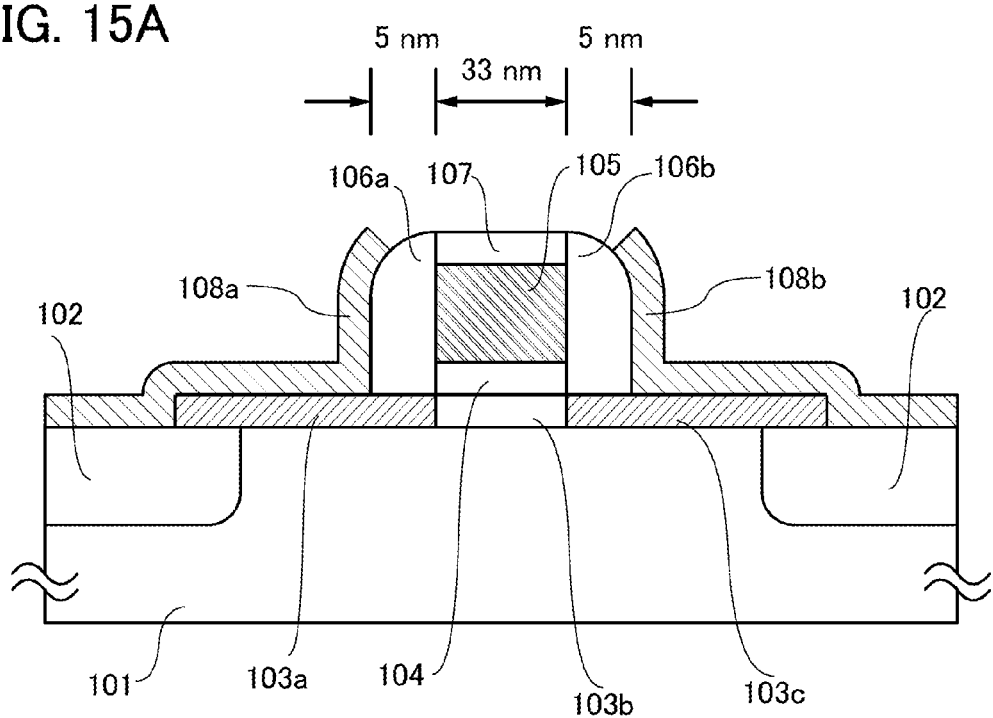
FIGS. 15A and 15B illustrate cross-sectional structures of transistors which are used in calculation.
Figure 15B:
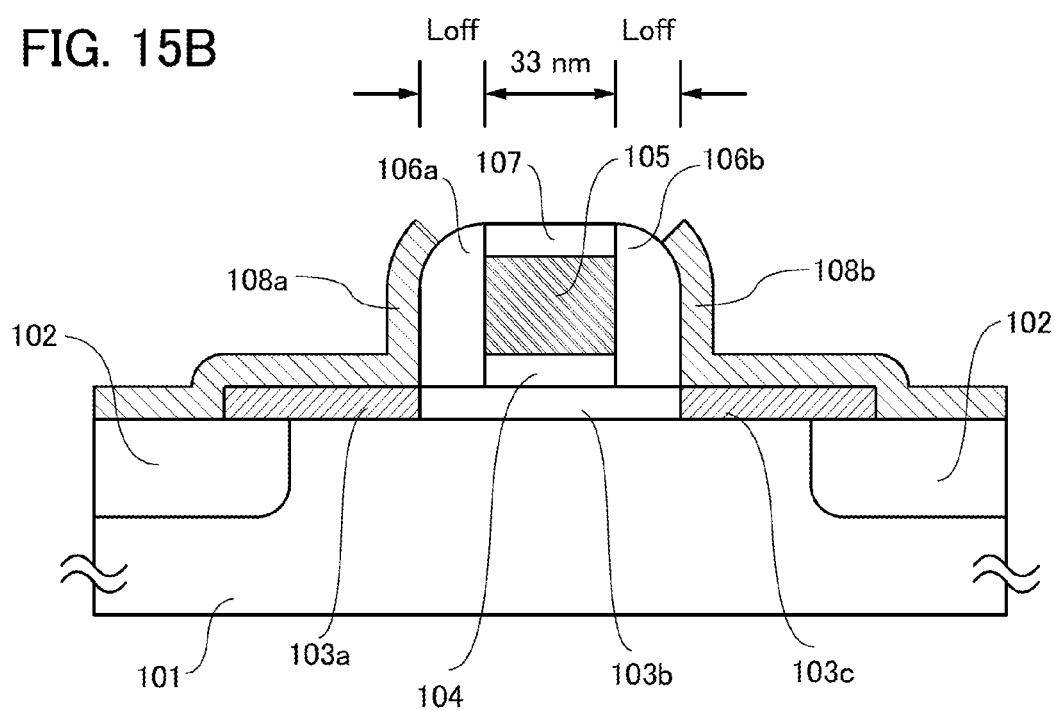

Further, FIGS. 14A to 14C show the gate voltage dependence of the drain current $I_d$ (a solid line) and the mobility μ (a dotted line) of the transistor having the structure illustrated in FIG. 15B where the offset length $L_{off}$ is 15 nm. The drain current $I_d$ was obtained by calculation under the assumption that the drain voltage was +1 V and the mobility μ was obtained by calculation under the assumption that the drain voltage was +0.1 V. FIG. 14A shows the gate voltage dependence of the transistor in the case where the thickness of the gate insulating layer is 15 nm, FIG. 14B shows that of the transistor in the case where the thickness of the gate insulating layer is 10 nm, and FIG. 14C shows that of the transistor in the case where the thickness of the gate insulating layer is 5 nm.

In either of the structures, as the gate insulating layer is thinner, the off-state current is significantly decreased, whereas no detectable change arises in the peak value of the mobility μ and the on-state current.

Note that the peak of the mobility μ is approximately 80 cm$^2$/Vs in FIGS. 12A to 12C, approximately 60 cm$^2$/Vs in FIGS. 13A to 13C, and approximately 40 cm$^2$/Vs in FIGS. 14A to 14C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much smaller than the decrease in the off-state current. Further, the graphs show that in either of the structures, the drain current exceeds 10 μA, which is required in a memory element and the like, at a gate voltage of around 1 V.

The transistors including an oxide semiconductor layer in which a channel is formed described in this embodiment are transistors with reduced off-state current. When such a transistor is used in a memory device of an embodiment of the present invention, the memory device can hold data for a long time.

When a transistor including a CAAC-OS is used, a field effect mobility higher than that of an amorphous oxide semiconductor can be achieved. Using this transistor having high mobility, a memory device can be driven at high speed even in the bootstrap operation.

This embodiment can be combined with any of the other embodiments as appropriate.

This application is based on Japanese Patent Application serial no. 2011-113949 filed with Japan Patent Office on May 20, 2011, the entire contents of which are hereby incorporated by reference.

What is claimed is:

1. A semiconductor device comprising:
 a transistor comprising a gate, a first terminal, and a second terminal;
 a power supply for supplying a power supply potential;
 a bootstrap circuit for inputting the power supply potential to the gate, the bootstrap circuit comprising a delay circuit and a capacitor;
 a first line for inputting a first signal to control the bootstrap circuit; and
 a second line for inputting a second signal to the first terminal,
 wherein the first signal has a potential equal to the power supply potential,
 wherein the delay circuit is configured to delay the first signal and input the delayed first signal to the capacitor, and
 wherein the second signal has a potential equal to the power supply potential or a grounded potential.

2. The semiconductor device according to claim 1, wherein the bootstrap circuit is configured to increase a potential of the gate by capacitive coupling of the capacitor caused by the delayed first signal when the power supply potential is input to the gate.

3. The semiconductor device according to claim 1, further comprising:
 a reading circuit for reading data stored in a node to which the second terminal is connected, and
 a third line for inputting a third signal to control the reading circuit,
 wherein the third signal has a potential equal to the power supply potential.

4. The semiconductor device according to claim 1, wherein the transistor has a channel formation region comprising an oxide semiconductor.

5. The semiconductor device according to claim 4, wherein the oxide semiconductor comprises indium.

6. The semiconductor device according to claim 1, wherein the semiconductor device is a memory device.

7. A semiconductor device comprising:
 a power supply for supplying a power supply potential;
 a controller electrically connected to the power supply;
 a transistor comprising a gate, a first terminal, and a second terminal, the gate being electrically connected to the controller;
 a first line electrically connected to the controller;
 a delay circuit electrically connected to the first line;
 a first capacitor electrically connected between the delay circuit and the gate; and
 a second line electrically connected to the first terminal.

8. The semiconductor device according to claim 7, wherein the controller is configured to input the power supply potential to the gate.

9. The semiconductor device according to claim 7,
 wherein the first line is configured to input a first signal to the controller and the delay circuit, and
 wherein the first signal has a potential equal to the power supply potential.

10. The semiconductor device according to claim 7,
 wherein the second line is configured to input a second signal to the first terminal, and
 wherein the second signal has a potential equal to the power supply potential.

11. The semiconductor device according to claim 7, further comprising:
 a reading circuit electrically connected to the second terminal; and
 a third line electrically connected to the reading circuit and configured to input a third signal to the reading circuit,
 wherein the third signal has a potential equal to the power supply potential.

12. The semiconductor device according to claim 11, further comprising a second capacitor comprising a first electrode and a second electrode, wherein the first electrode of the second capacitor is electrically connected to the second terminal and the reading circuit.

13. The semiconductor device according to claim 12, wherein the second electrode of the second capacitor is grounded.

14. The semiconductor device according to claim 12, wherein the transistor has a channel formation region comprising an oxide semiconductor.

15. The semiconductor device according to claim 14, wherein the oxide semiconductor comprises indium.

16. The semiconductor device according to claim 7, wherein the semiconductor device is a memory device.

17. A semiconductor device comprising:
 a power supply for supplying a power supply potential;
 a first transistor comprising a gate, a first terminal, and a second terminal;
 a controller comprising:
  a diode electrically connected between the power supply and the gate of the first transistor; and
  a second transistor comprising a gate, a first terminal, and a second terminal, the second terminal of the second transistor being electrically connected to the power supply through the diode;
 a first capacitor electrically connected to the gate of the first transistor;
 a first line electrically connected to the gate of the second transistor;
 a first delay circuit electrically connected between the first line and the first capacitor; and
 a second line electrically connected to the first terminal of the first transistor.

18. The semiconductor device according to claim 17, wherein the first terminal of the second transistor is grounded.

19. The semiconductor device according to claim 17, wherein the controller further comprises an inverter electrically connected between the first line and the gate of the second transistor.

20. The semiconductor device according to claim 17,
 wherein the controller further comprises a third transistor having a gate, a first terminal, and a second terminal,
 wherein the first terminal and the second terminal of the third transistor are electrically connected to the power supply and the diode, respectively,
 wherein the gate of the third transistor is electrically connected to the gate of the second transistor, and
 wherein a polarity of the second transistor is different from a polarity of the third transistor.

21. The semiconductor device according to claim 20, further comprising an inverter, wherein the inverter is electrically connected between the first line and the gate of the second transistor.

22. The semiconductor device according to claim 20, wherein the controller further comprises:
   a NOR circuit electrically connected between the gate of the second transistor and the first line; and
   a second delay circuit electrically connected between the NOR circuit and the first line.

23. The semiconductor device according to claim 22, wherein the NOR circuit is electrically connected to the first delay circuit.

24. The semiconductor device according to claim 17,
   wherein the first line is configured to input a first signal to the controller and the first delay circuit, and
   wherein the first signal has a potential equal to the power supply potential.

25. The semiconductor device according to claim 17,
   wherein the second line is configured to input a second signal to the first terminal of the first transistor, and
   wherein the second signal has a potential equal to the power supply potential.

26. The semiconductor device according to claim 17, further comprising:
   a reading circuit electrically connected to the second terminal of the first transistor; and
   a third line electrically connected to the reading circuit and configured to input a third signal to the reading circuit,
   wherein the third signal has a potential equal to the power supply potential.

27. The semiconductor device according to claim 26, further comprising a second capacitor comprising a first electrode and a second electrode, wherein the first electrode of the second capacitor is electrically connected to the second terminal of the first transistor and the reading circuit.

28. The semiconductor device according to claim 27, wherein the second electrode of the second capacitor is grounded.

29. The semiconductor device according to claim 17, wherein the first transistor has a channel formation region comprising an oxide semiconductor.

30. The semiconductor device according to claim 29, wherein the oxide semiconductor comprises indium.

31. The semiconductor device according to claim 17, wherein the semiconductor device is a memory device.

* * * * *